(12) United States Patent
Kudo et al.

(10) Patent No.: US 7,898,499 B2
(45) Date of Patent: Mar. 1, 2011

(54) ELECTROMAGNETIC WAVE SHIELDING BODY

(75) Inventors: Toshio Kudo, Hyogo (JP); Kazuyuki Kashihara, Hyogo (JP); Katsunori Hosotani, Wakayama (JP); Satoshi Sakai, Wakayama (JP)

(73) Assignee: Mitsubishi Cable Industries, Ltd., Tokyo (JP)

( * ) Notice: Subject to any disclaimer, the term of this patent is extended or adjusted under 35 U.S.C. 154(b) by 737 days.

(21) Appl. No.: 11/816,393

(22) PCT Filed: Feb. 15, 2006

(86) PCT No.: PCT/JP2006/302660
§ 371 (c)(1),
(2), (4) Date: Aug. 15, 2007

(87) PCT Pub. No.: WO2006/088063
PCT Pub. Date: Aug. 24, 2006

(65) Prior Publication Data
US 2009/0027300 A1    Jan. 29, 2009

(30) Foreign Application Priority Data

Feb. 18, 2005  (JP) ............................. 2005-042184
Feb. 22, 2005  (JP) ............................. 2005-046213
Jul. 1, 2005   (JP) ............................. 2005-193449
Jan. 10, 2006  (JP) ............................. 2006-002338

(51) Int. Cl.
*H01Q 13/14* (2006.01)
(52) U.S. Cl. ..................................... 343/912
(58) Field of Classification Search ......... 343/909–912, 343/797, 793, 700 MS
See application file for complete search history.

(56) References Cited

U.S. PATENT DOCUMENTS 3,855,598 A * 12/1974 Keller ........................ 343/840

(Continued)

FOREIGN PATENT DOCUMENTS

CN         1457630 A      11/2003

(Continued)

OTHER PUBLICATIONS

Yoshihisa Irimajiri, Toshiaki Takano and Munetoshi Tokumaru, "Frequency Selective Surfaces for Radio Astronomy—Characteristics of 40/80 GHz FFS—", The Institute of Electronics, Information and Communication Engineers, vol. J73-B-II, No. 1, pp. 20-26, Jan. 1990.

(Continued)

*Primary Examiner*—Huedung Mancuso
(74) *Attorney, Agent, or Firm*—Roberts Milotkowski Safran & Cole, P.C.; Thomas W. Cole

(57) ABSTRACT

An electromagnetic screen (1) comprises a plurality of antennas (4) each of which reflects an electromagnetic wave having a specific frequency. The plurality of antennas (4) are arranged so as to constitute a pattern. Each of the antennas (4) has three segment-shaped first element parts (4a) and three segment-shaped second element parts (4b). The three first element parts (4a) radially extend from the center of the antenna (4) by substantially the same length such that any two of the three first element parts (4a) form an angle of 120° with each other. Each of the second element parts (4b) are connected to an outer edge of a corresponding one of the first element parts (4a).

18 Claims, 24 Drawing Sheets

U.S. PATENT DOCUMENTS

| | | | |
|---|---|---|---|
| 4,656,487 A | | 4/1987 | Sureau et al. |
| 5,579,019 A | * | 11/1996 | Uematsu et al. ............. 343/771 |
| 6,054,967 A | * | 4/2000 | Wu et al. .................... 343/909 |
| 6,884,936 B2 | | 4/2005 | Takahashi et al. |
| 7,358,913 B2 | * | 4/2008 | Ebling et al. ................ 343/753 |
| 7,420,524 B2 | * | 9/2008 | Werner et al. ............... 343/909 |

FOREIGN PATENT DOCUMENTS

| | | |
|---|---|---|
| JP | 6-99972 B2 | 12/1994 |
| JP | 10-126090 A | 5/1998 |
| JP | 10-126091 A | 5/1998 |
| JP | 10-169039 A | 6/1998 |
| JP | 11-195890 A | 7/1999 |
| JP | 11-261286 A | 9/1999 |
| JP | 11-307989 A | 11/1999 |
| JP | 11-330773 A | 11/1999 |
| JP | 2000-196288 A | 7/2000 |
| JP | 2001-345632 A | 12/2001 |
| JP | 2003-60430 A | 2/2003 |
| JP | 2003-69282 A | 3/2003 |
| JP | 2003-258487 A | 9/2003 |
| JP | 2004-53466 A | 2/2004 |
| JP | 2005-142748 A | 6/2005 |
| WO | 2004008570 A2 | 1/2004 |

OTHER PUBLICATIONS

International Search Report for PCT/JP2006/302660 mailed Apr. 11, 2006.
Office Action issued by Chinese Patent Office in corresponding Chinese Patent Application No. 200680005137X dated Mar. 27, 2009.
Office Action issued by the Japanese Patent Office in corresponding Japanese Patent Application No. 2005-193449 mailed Apr. 20, 2010.
Office Action issued by the Japanese Patent Office in corresponding Japanese Patent Application No. 2006-002338 mailed Aug. 17, 2010.
European Search Report dated Nov. 5, 2010 issued in corresponding European Patent Application No. EP 06 71 3801.

* cited by examiner

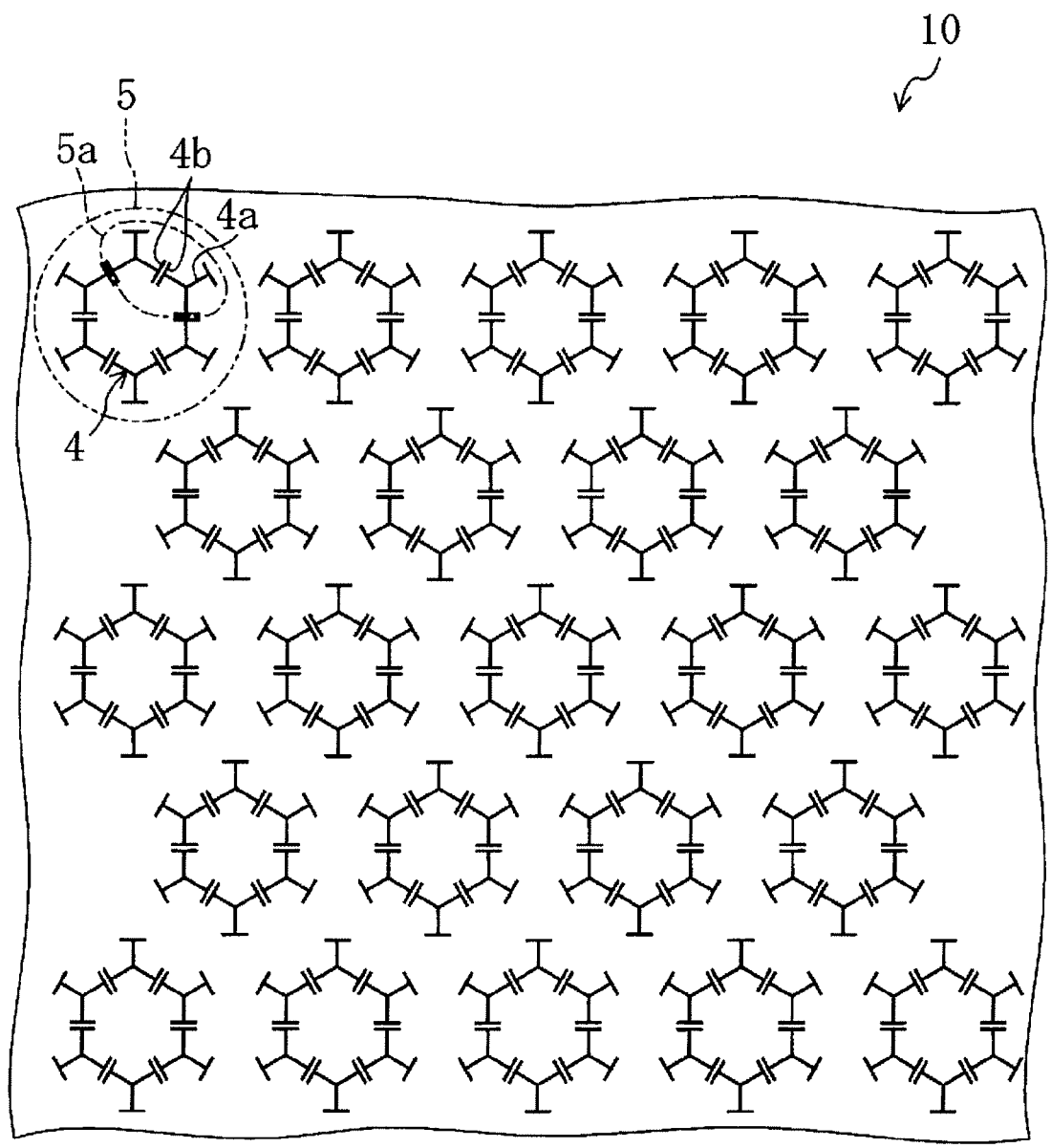

ELECTROMAGNETIC WAVE SHIELDING BODY

TECHNICAL FIELD

The present invention relates to an electromagnetic screen.

BACKGROUND ART

As an office PHS and a wireless LAN have been increasingly used in recent years, it has been crucial to create an electromagnetic wave environment in an office from the perspectives of preventing information leakage and also malfunction and noise due to externally intruding electromagnetic waves. There have been proposed various types of members for creating the electromagnetic wave environment in the office, or the like (e.g., Patent documents 1 and 2, etc.).

Patent document 1 discloses an electromagnetic shielding intelligent building in which information can be communicated with use of an electromagnetic wave having an arbitrary frequency in a wide frequency band by adding an electromagnetic shielding member such as metal or ferrite to a building frame. As the electromagnetic shielding member, there are disclosed electromagnetic wave reflectors such as a steel plate, metal net, metal mesh, and metal foil, and electromagnetic wave absorbers such as ferrite.

However, such electromagnetic wave reflectors and absorbers have no frequency selectivity. For this reason, the electromagnetic shielding intelligent building disclosed in Patent document 1 has a problem that because an electromagnetic wave having a specific frequency cannot be selectively shielded, electromagnetic waves other than that having the frequency to be shielded are also shielded.

On the other hand, Patent document 2 discloses an electromagnetic shielding building characterized in that an electromagnetic shielding space is ensured in the building with use of an electromagnetic shielding surface in which Y-shaped linear antennas are cyclically arrayed. The Y-shaped linear antenna is comprised of three segment-shaped elements radially extending from the center of the antenna by substantially the same length. Patent document 2 describes that the electromagnetic shielding building disclosed therein can select and electromagnetically shield an electromagnetic wave having an unnecessary frequency.

Patent document 1: Japanese Patent Publication No. 6-99972
Patent document 2: Japanese Unexamined Patent Application Publication No. 10-169039.

Problems that the Invention is to Solve

In the electromagnetic shielding building described in Patent document 2, the linear antenna for reflecting the electromagnetic wave is formed in the Y-shape. In order to surely reflect the electromagnetic wave having the specific frequency, preferably the linear antennas are efficiently and densely arrayed on the electromagnetic shielding surface. However, regarding the Y-shaped antenna disclosed in Patent document 2, it is difficult to efficiently and densely arrange (many more linear antennas per unit area).

Also, in order to provide a high electromagnetic wave shielding property, it is particularly preferable that the elements are arranged so as to closely face to each other. However, regarding the Y-shaped antenna disclosed in Patent document 2, it is difficult to arrange the elements so as to make them face to each other in substantially parallel.

For this reason, the electromagnetic shielding building described in Patent document 2 has a problem that it is difficult to shield the electromagnetic wave having the specific frequency at a higher shielding ratio.

Also, a conventional electromagnetic screen has a large 10 dB bandwidth with respect to a matching frequency, so that electromagnetic waves having frequencies other than an intended specific frequency are also shielded. That is, the conventional electromagnetic screen has a problem of low frequency selectivity.

The present invention is made in consideration of such problems, and it is therefore an object of the present invention to provide an electromagnetic screen having a higher electromagnetic wave shielding ratio for an electromagnetic wave having a specific frequency.

DISCLOSURE OF THE INVENTION

A first electromagnetic screen according to the present invention includes a plurality of antennas each of which reflects an electromagnetic wave having a specific frequency. The plurality of antennas are arranged so as to constitute a pattern. Each of the antennas has three segment-shaped first element parts and three segment-shaped second element parts. The three first element parts radially extend from the center of the antenna by substantially the same length such that any two of the three first element parts form an angle of 120° with each other. Each of the second element parts is connected to an outer edge of a corresponding one of the first element parts.

In the first electromagnetic screen according to the present invention, the antenna has frequency selectivity. For this reason, the first electromagnetic screen according to the present invention can selectively shield the electromagnetic wave having the specific frequency and transmit therethrough electromagnetic waves having the other frequencies.

In addition, the antenna of the first electromagnetic screen according to the present invention has higher frequency selectivity than the conventional Y-shaped linear antenna. In other words, the antenna of the first electromagnetic screen according to the present invention has a relatively narrow frequency width with respect to a reflection peak (e.g., 10 dB bandwidth with respect to a matching frequency). For this reason, the first electromagnetic screen according to the present invention can shield the electromagnetic wave having the specific frequency at higher selectivity. Further, by making lengths of the first and second element parts different from each other, much higher frequency selectivity for the specific frequency can be provided.

Note that the "matching frequency", as used herein, refers to a frequency at which a transmission attenuation is maximized. The matching frequency is also referred to as a center frequency.

Also, as described above, the antenna of the first electromagnetic screen according to the present invention has the second element parts each connected to the outer edge of a corresponding one of the first element parts. For this reason, it is easy to arrange the plurality of antennas such that the second element parts each belonging to a corresponding one of the antennas face to each other. By arranging the plurality of antennas such that the second element parts each belonging to a corresponding one of the antennas are made to face to each other as above (more preferably, to closely face to each other), the electromagnetic wave shielding ratio for the electromagnetic wave having the specific frequency can be improved.

From the perspectives of making the second element parts face to each other and arranging many more antennas per unit area, it is preferable that the second element part is connected at its center to the outer edge of the first element part, and the lengths of the second and first element parts are substantially the same as each other.

In addition, the facts that by making the second element parts face to each other, the electromagnetic wave shielding ratio for the electromagnetic wave having the specific frequency can be improved, and that by making narrow a distance between the second element parts facing to each other, the electromagnetic wave shielding ratio for the electromagnetic wave having the specific frequency can be further improved were first found by the inventors as a result of intensive studies.

In the first electromagnetic screen according to the present invention, the lengths of the first and second element parts can be appropriately determined based on a frequency (specific frequency) of an electromagnetic wave to be shielded. For example, if the lengths of the first and second element parts are the same as each other, the specific frequency can be lowered by making long the lengths of the first and second element parts. Alternatively, for example, by adjusting the length of the second element part while fixing that of the first element part constant, the specific frequency may be adjusted.

For example, in the conventional Y-shaped linear antenna (antenna not having any second element part but consisting of only the first element parts), the specific frequency can be adjusted only by adjusting the length of the first element part. On the other hand, in the first electromagnetic screen according to the present invention, as described above, the specific frequency can be adjusted by adjusting the length of the first element part of each of the antennas, or alternatively by adjusting a ratio of the length of the second element part to that of the first element part. For this reason, the first electromagnetic screen according to the present invention has a wide design margin.

In the first electromagnetic screen according to the present invention, the plurality of antennas may constitute a plurality of antenna units each of which is comprised of a pair of the antennas placed such that the second element parts each belonging to a corresponding one of the pair of the antennas face to each other.

By arranging the plurality of antennas such that the second element parts each belonging to a corresponding one of the antennas face to each other, electromagnetic wave reflectance of the antenna for the electromagnetic wave having the specific frequency can be further increased. Accordingly, such a configuration can provide a much higher electromagnetic wave shielding ratio for the electromagnetic wave having the specific frequency. From the perspective of improving the electromagnetic wave shielding ratio for the electromagnetic wave having the specific frequency, it is preferable that the distance between the second element parts facing to each other is narrow.

Also, the plurality of antennas may constitute a plurality of hexagonal (preferably, substantially regular hexagonal) antenna assemblies in each of which the plurality of antenna units are placed and continuously developed in two dimensions such that the second element parts each belonging to a corresponding one of the plurality of antenna units face to each other. In other words, six of the antennas (three antenna units) may be circularly arranged such that the second element parts respectively belonging to any neighboring two of the six antennas face to each other. In such a configuration, a figure created by connecting the respective centers of the circularly arranged six antennas forms into a hexagon (preferably, substantially regular hexagon).

In order to increase the electromagnetic shielding ratio (the electromagnetic wave reflectance) of the antenna for the electromagnetic wave having the specific frequency, it is preferable to increase a ratio of the number of the second element parts arranged so as to face to each other to the total number of the second element parts. Such a configuration can increase the number of the second antennas in each of which any of the three second elements face to that of the other antenna. For this reason, the electromagnetic wave reflectance of the antenna for the electromagnetic wave having the specific frequency can be increased. Accordingly, such a configuration can provide a higher electromagnetic shielding ratio for the electromagnetic wave having the specific frequency.

A second electromagnetic screen according to the present invention includes a plurality of types of antennas arranged so as to constitute a pattern. The plurality of types of antennas respectively reflect electromagnetic waves having specific frequencies different from one another. Each of the plurality of types of antennas includes three segment-shaped first element parts and three segment-shaped second element parts. The three segment-shaped first element parts radially extend from the center of the antenna by substantially the same length such that any two of the three first element parts form an angle of 120° with each other. Each of the second element parts is connected to an outer edge of a corresponding one of the first element parts.

Each of the plurality of types of antennas has frequency selectivity. That is, each of the plurality of types of antennas selectively reflects an electromagnetic wave having a frequency different from those for the other types, depending on the type. For this reason, the second electromagnetic screen according to the present invention can selectively shield a plurality of types of electromagnetic waves having frequencies different from one another, and transmit therethrough electromagnetic waves having the other frequencies.

In the second electromagnetic screen according to the present invention, the plurality of types of antennas are preferably different in size from one another, A third electromagnetic screen according to the present invention includes a plurality of first antennas and a plurality of second antennas, which are arranged so as to constitute a pattern. Each of the first antennas reflects an electromagnetic wave having a first frequency. Also, each of the second antennas reflects an electromagnetic wave having a second frequency different from the first frequency. Each of the first and second antennas has three segment-shaped first element parts and three segment-shaped second element parts. The three first element parts radially extend from the center of the antenna by substantially the same length such that any two of the three first element parts form an angle of 120° with each other. Each of the second element parts is connected to an outer edge of a corresponding one of the first element parts.

In the third electromagnetic screen according to the present invention, each of the first and second antennas has frequency selectivity. That is, each of the first and second antennas selectively reflects an electromagnetic wave having a corresponding specific frequency. Specifically, the first antenna reflects an electromagnetic wave having a first frequency. Also, the second antenna reflects an electromagnetic wave having a second frequency. For this reason, the third electromagnetic screen according to the present invention can selectively shield the electromagnetic waves having the two types of specific frequencies (first and second frequencies), and transmit therethrough electromagnetic waves having the other frequencies.

For example, in the wireless LAN, electromagnetic waves having two types of frequencies are used, i.e., an electromagnetic wave having a frequency of 2.4 GHz and that having a frequency of 5.2 GHz. For this reason, in an environment where the wireless LAN is used, there is required an electromagnetic screen that selectively shields the electromagnetic waves having the two types of frequencies used for the wireless LAN, and transmits therethrough electromagnetic waves having the other frequencies, which are not used for the wireless LAN (e.g., electromagnetic waves used for cellular phone communications, those for TV broadcasting, etc.). As described above, the third electromagnetic screen according to the present invention can selectively shield the electromagnetic waves having the two types of specific frequencies, and transmit therethrough the electromagnetic waves having the other frequencies. Accordingly, the third electromagnetic screen according to the present invention can be conveniently used in such an environment where the wireless LAN is used.

In addition, an electromagnetic screen capable of selectively shielding electromagnetic waves having two types of frequencies includes one in which Y-shaped linear antennas of two types different in size from each other are formed. However, it is difficult to efficiently, densely, and uniformly arrange the Y-shaped linear antennas of the two types different in size from each other (or arrange many more linear antennas per unit area). For this reason, it is difficult for an electromagnetic screen in which the Y-shaped linear antennas of a plurality of types different in size from one another are formed to shield electromagnetic waves having a plurality of specific frequencies at a sufficiently high shielding ratio.

Contrarily, in the third electromagnetic screen, the first and second antennas each having the second element parts can be arranged so as to respectively configure aspects in each of which the second element parts face to each other, and arranging a relatively large number of antennas (first and second antennas) per unit area is relatively easy. Accordingly, the third electromagnetic screen according to the present invention having the first and second antennas can shield two types of electromagnetic waves having different frequencies at a high electromagnetic wave shielding ratio.

In addition, the antenna (first and second antennas) included in the third electromagnetic screen according to the present invention has much higher frequency selectivity than the conventional Y-shaped linear antenna. In other words, a frequency width with respect to a reflection peak is relatively narrow. For this reason, the third electromagnetic screen according to the present invention can shield electromagnetic waves having two types of desired frequencies (specifically, the first and second frequencies. The "first and second frequencies" are hereinafter occasionally referred to as "specific frequencies") with higher selectivity. Further, by making the lengths of the first and second element parts different from each other, much higher frequency selectivity for each of the specific frequencies can be provided.

In the third electromagnetic screen according to the present invention, the lengths of the first and second element parts can be appropriately determined depending on frequencies (specific frequencies) of electromagnetic waves to be reflected. For example, if the lengths of the first and second element parts are the same as each other, the specific frequencies can be lowered by increasing the lengths of the first and second element parts. Alternatively, for example, by adjusting the length of the second element part while fixing that of the first element part constant, the specific frequencies may be adjusted.

For example, in the conventional Y-shaped linear antenna (antenna not having any second element part but consisting of only the first element parts), the specific frequencies can be adjusted only by adjusting the length of the first element part. Contrarily, in the third electromagnetic screen according to the present invention, as described above, the specific frequencies can be adjusted by adjusting the length of the first element part, or alternatively by adjusting a ratio of the length of the second element part to that of the first element part. For this reason, the third electromagnetic screen according to the present invention has a wide design margin.

In addition, the first and second antennas are preferably different in size from each other.

In the third electromagnetic screen according to the present invention, it is preferable that the plurality of first antennas constitute a plurality of first antenna units each of which is comprised of a pair of the first antennas in which the second element parts each belonging to a corresponding one of the pair of the first antennas are placed so as to face to each other. Also, it is preferable that the plurality of second antennas constitute a plurality of second antenna units each of which is comprised of a pair of the second antennas in which the second element parts each belonging to a corresponding one of the pair of the second antennas are placed so as to face to each other.

Such a configuration can further increase the electromagnetic wave reflectance (electromagnetic wave shielding ratio) for each of the electromagnetic waves having the specific frequencies (first and second frequencies). Accordingly, an electromagnetic screen capable of shielding electromagnetic waves having specific frequencies at a much higher shielding ratio can be provided. From the perspective of improving the electromagnetic shielding ratio for each of the electromagnetic waves having the specific frequencies, a distance between the second element parts facing to each other is preferably narrow, in each of the first and second antennas.

Also, it is preferable that the plurality of first antennas further constitute a plurality of hexagonal (preferably, substantially regular hexagonal) first antenna assemblies in each of which the plurality of first antenna units are placed and continuously developed in two dimensions such that the second element parts each belonging to a corresponding one of the first antennas face to each other. Further, it is preferable that the plurality of second antennas further constitute a plurality of hexagonal (preferably, substantially regular hexagonal) second antenna assemblies in each of which the plurality of second antenna units are placed and continuously developed in two dimensions such that the second element parts each belonging to a corresponding one of the second antennas face to each other.

In such a configuration, six of the first antennas are circularly arrayed, and a figure created by connecting the respective centers of the six first antennas forms into a substantially regular hexagon. Similarly, six of the second antennas are circularly arrayed, and a figure created by connecting the respective centers of the six second antennas forms into a substantially regular hexagon.

In order to increase the electromagnetic shielding ratio (electromagnetic wave reflectance) of the antenna for each of the electromagnetic waves having the specific frequencies, it is preferable to increase a ratio of the number of the second element parts arranged so as to face to each other to the total number of the second element parts. Such a configuration can increase the ratio of the number of the second antennas in each of which any of the three second element parts face to that of the other antenna. For this reason, the electromagnetic wave reflectance of the first antenna for the electromagnetic wave having the first frequency, and that of the second antenna for the electromagnetic wave having the second frequency can be further increased. Accordingly, such a configuration can provide an electromagnetic screen capable of shielding electromagnetic waves having specific frequencies (first and second frequencies) at higher electromagnetic wave shielding ratios.

Also, in the third electromagnetic screen according to the present invention, the second antenna assembly may be surrounded by the first antenna assembly. Such a configuration enables the first and second antenna assemblies to be efficiently arranged, so that the numbers of the first and second antennas included per unit area can be respectively increased. Accordingly, such a configuration can provide an electromagnetic screen capable of shielding electromagnetic waves having first and second frequencies at much higher electromagnetic wave shielding ratios.

Also, such a configuration can make the numbers of the first and second antenna assemblies (numbers of the first and second antennas) the same.

In addition, the plurality of first antennas constituting the first antenna assembly and the plurality of second antennas constituting the second antenna assembly preferably do not interfere with each other. That is, the first antenna and the second antenna preferably do not come into contact with each other.

Also, in such a configuration, if, in particular, a frequency (first frequency) of an electromagnetic wave corresponding to the first antenna and that (second frequency) of an electromagnetic wave corresponding to the second antenna are close to each other, the first antenna assembly and the second antenna assembly preferably have symmetrical axes different from each other. In other words, the first antenna assembly and the second antenna assembly are preferably not adapted to have the same symmetrical axis. Specifically, the second antenna assembly preferably has a symmetrical axis forming an angle with that of the first antenna assembly. Such a configuration can effectively suppress interference between the first and second antennas.

Note that the condition herein where the first frequency and the second frequency are close to each other refers to a condition where a ratio of the first frequency to the second frequency (first frequency<second frequency) is equal to or more than 0.45.

Specifically, if the first frequency is 2.45 GHz and the second frequency is 5.2 GHz, the ratio of the first frequency to the second frequency is 0.47. Accordingly, this case is referable to a positional relationship in which the first frequency and the second frequency are close to each other.

To explain with reference to FIG. 34, a large, substantially regular hexagon (first antenna assembly) and a small, substantially regular hexagon (second antenna assembly) surrounded by the large, substantially regular hexagon (first antenna assembly) respectively have symmetrical axes different from each other. Specifically, the second antenna assembly has a symmetrical axis forming an angle of 10° with that of the first antenna assembly.

This angle θ depends on magnitudes of the first and second frequencies; however, if the first frequency is 2.45 GHz and the second frequency is 5.2 GHz, then the θ is preferably not less than 2° and not more than 40°. More preferably, it is not less than 5° and not more than 20°. Still more preferably, it is not less than 10° and not more than 15°. By configuring in this manner, the interference (contact) between the first antenna and the second antenna can be effectively suppressed.

In the first, second, or third electromagnetic screen according to the present invention, each of the antennas preferably includes an electrically conductive material.

The electromagnetic wave reflectance of the antenna for the electromagnetic wave having the specific frequency correlates with conductivity of the antenna. With increasing conductivity of the antenna (with decreasing electrical resistance of the antenna), the electromagnetic wave reflectance of the antenna for the electromagnetic wave having the specific frequency increases. For this reason, by increasing the conductivity of the antenna, the electromagnetic wave reflectance of the antenna for the electromagnetic wave having the specific frequency can be increased. Accordingly, such a configuration can provide a high electromagnetic wave shielding ratio for the electromagnetic wave having the specific frequency.

The electrically conductive material includes aluminum, silver, copper, gold, platinum, iron, carbon, graphite, and indium tin oxide (ITO), and a mixture or alloy of them. Among them, the antenna preferably includes at least any of copper, aluminum, and silver because copper, aluminum, and silver are relatively low-cost.

In the first, second, or third electromagnetic screen according to the present invention, the length of the second element part of each of the antennas is preferably more than 0 times and less than $2(3)^{1/2}$ times the length of the first element part of the antenna. This is because if the length of the second element part is equal to or more than $2(3)^{1/2}$ times the length of the first element part, a neighboring second element part comes into contact with it, resulting in a loss of a desired electromagnetic wave shielding effect. From the perspective of achieving a preferable electromagnetic wave shielding effect, the length of the second element part is preferably not less than 0.5 times and not more than 2 times the length of the first element part. More preferably, it is not less than 0.75 times and not more than 2 times.

In the first, second, or third electromagnetic screen according to the present invention, the second element part preferably forms a right angle with the first element part connected therewith. Such a configuration can efficiently and densely arrange the respective antennas.

In the first, second, or third electromagnetic screen according to the present invention, the second element part is preferably connected at its center to the first element part. Such a congifuration can efficiently and densely arrange the respective antennas.

In the first, second, or third electromagnetic screen according to the present invention, the first element part and the second element part may have substantially the same length.

In the first, second, or third electromagnetic screen according to the present invention, each of the antennas may be comprised of a metal film having an opening. If each of the antennas is comprised of the metal film having the opening, the antenna transmits light therethrough to some extent, and becomes less conspicuous. Accordingly, an electromagnetic screen unlikely to block view can be provided. From the perspective of a good view, an area ratio of the metal film to the antenna is preferably not less than 2.5% and not more than 30%.

Note that the "metal film having the opening" refers to a metal film formed in a mesh-like shape in plan view, such as a lattice shape in plan view (triangle lattice, hexagonal lattice, Collins lattice, etc.), a metal film formed with a plurality of micropores having a circular shape (or oval or polygonal shape) in plan view, or other metal film.

As described above, the present invention can provide an electromagnetic screen capable of shielding an electromagnetic wave having a specific frequency at a high electromagnetic wave shielding ratio.

BRIEF DESCRIPTION OF THE DRAWINGS

FIG. 11 is a plan view of an electromagnetic screen 10 according to Embodiment 2.

BEST MODE FOR CARRYING OUT THE INVENTION

Embodiments of the present invention will hereinafter be described in detail with reference to the drawings.

Embodiment 1

Figure 1A:
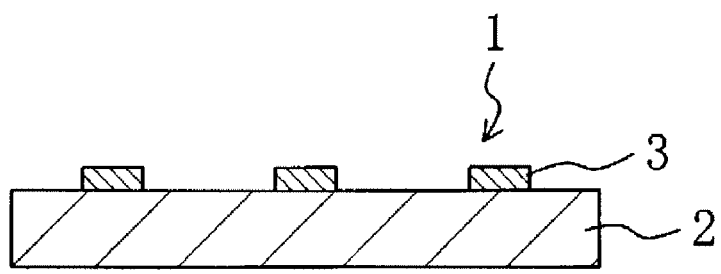
FIG. 1 is a diagram illustrating a structure of an electromagnetic screen 1 according to Embodiment 1.
Figure 1B:
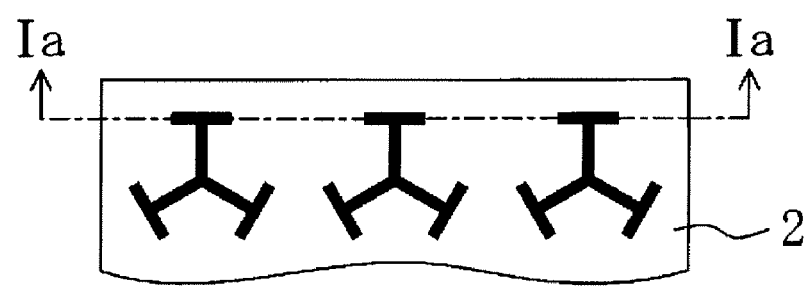

FIG. 1 is a diagram illustrating a structure of an electromagnetic screen 1 according to Embodiment 1. Specifically, FIG. 1(b) is a plan view of the electromagnetic screen 1 according to Embodiment 1. FIG. 1(a) is a cross-sectional view of FIG. 1(b) cut along the cutting line Ia-Ia.

Figure 2:
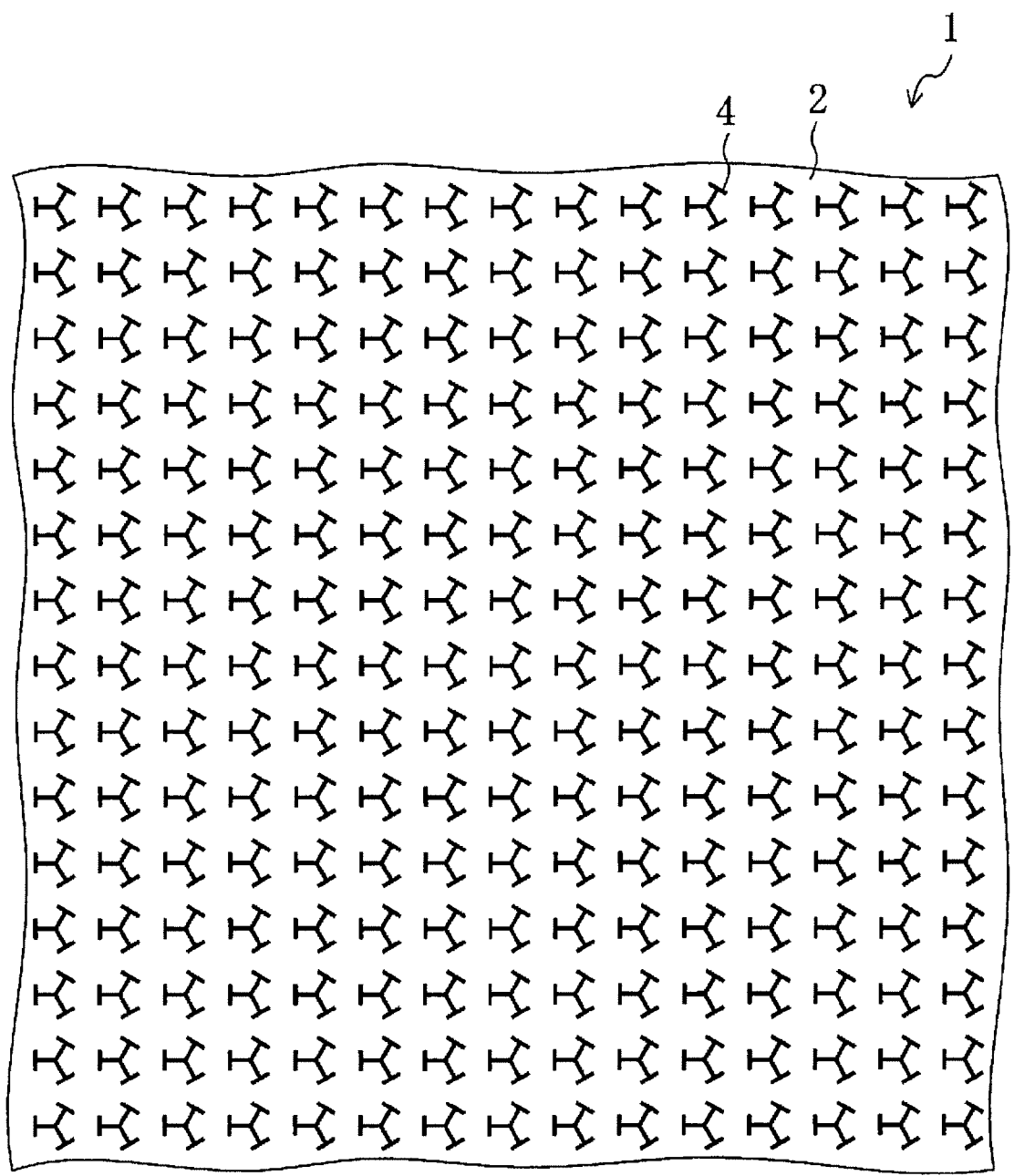
FIG. 2 is a plan view of the electromagnetic screen 1.

FIG. 2 is a plan view of the electromagnetic screen 1.

Figure 3:
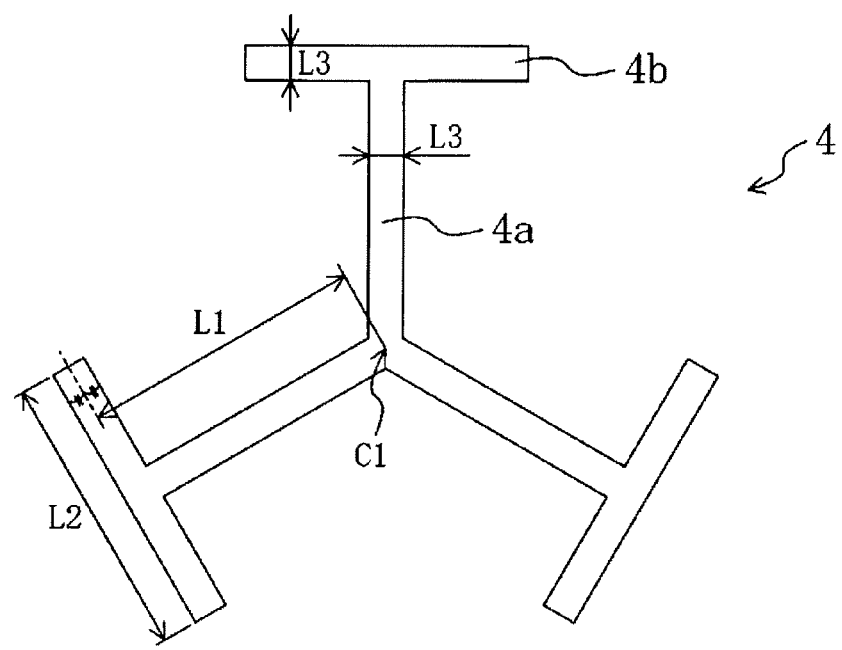
FIG. 3 is a plan view illustrating a configuration of an antenna 4.

FIG. 3 is a plan view illustrating a configuration of an antenna 4.

The electromagnetic screen 1 has a base material 2 and a reflective layer 3 formed on a surface of the base material 2.

Note that in Embodiment 1, the electromagnetic screen 1 has an aspect in which the reflective layer 3 is formed on the surface of the base material 2. However, the electromagnetic screen according to the present invention is not limited to such a configuration. The electromagnetic screen according to the present invention may have an aspect in which, for example, the reflective layer 3 is embedded in the base material 2.

The electromagnetic screen 1 may have an aspect in which an electromagnetic wave shielding property is provided to, for example, existing objects in a room (such as a window, wall, ceiling, floor, partition, and desk). In such a case, the base material 2 is preferably in a shape having a flat surface, such as a plate-like, sheet-like, or film-like shape.

A material for the base material 2 is not limited at all. The material for the base material 2 can be appropriately selected depending on an application of the electromagnetic screen 1. A specific example of the material for the base material 2 includes, for example, resin, glass, paper, fabric, rubber, plaster, tile, wood, etc.

It is particularly preferable that the base material 2 plays not only a role as simply a base material (e.g., role to secure mechanical endurance of the electromagnetic screen 1) but also a role to provide various characteristics (optical transparency, nonflammability, flame retardancy, halogen free, flexibility, impact resistance, heat resistance, etc.) to the electromagnetic screen.

For example, in a case where the electromagnetic screen 1 has optical transparency, the base material 2 is preferably formed from a transparent material. The transparent material includes, for example, transparent glass and transparent polymer. Of them, the transparent polymer is preferable as the material for the base material 2 in that it can be thinly formed and is rich in flexibility to be thereby able to be wound (formed into a roll-like shape) (a film formed from the transparent polymer is hereinafter referred to as a "transparent polymer film").

A material for the transparent polymer film includes, for example, polyethylene terephthalate, polyether sulfone, polystyrene, polyethylene naphthalate, polyarylate, polyether ether ketone, polycarbonate, polyethylene, polypropylene, polymethylpentene-1 (TPX), polyamide (e.g., nylon-6, etc.), polyimide, cellulosic resin (e.g., triacetyl cellulose, etc.), polyurethane, fluororesin (e.g., polytetrafluoroethylene, etc.), vinyl compound (e.g., polyvinyl chloride, etc.), polyacrylic acid, polyacrylic acid ester, polyacrylonitrile, addition polymer of vinyl compound, polymethacrylic acid, polymethacrylic acid ester, vinylidene compound (e.g., polyvinylidene chloride, etc.), vinylidene fluoride/trifluoroethylene copolymer, vinyl compound (e.g., ethylene/vinyl acetate copolymer, etc.), fluorine compound copolymer, polyether (e.g., polyethylene oxide, etc.), epoxy resin, polyvinyl alcohol, polyvinyl butyral, etc.

Also, the base material 2 may be any polymer as described above containing an ultraviolet absorber.

A specific example of the transparent glass material includes, for example, soda lime glass, quartz, etc. Of them, the soda lime glass, which is low-cost, is preferable. Also, heat ray shielding glass (e.g., heat ray absorbing glass, heat ray reflecting glass, etc.) is preferable.

A thickness of the transparent polymer film used for the electromagnetic screen 1 is typically not less than 10 μm and not more than 500 μm. Preferably, the thickness of the transparent polymer film is not less than 30 μm and not more than 150 μm. More preferably, it is not less than 50 μm and not more than 120 μm. If the transparent polymer film is thinner than 10 μm, forming the reflective film 3 tends to be difficult, whereas if it is thicker than 500 μm, its flexibility tends to decrease, resulting in difficulty in winding it (difficulty in forming it into a roll-like shape). Further, if the transparent polymer film is thicker than 500 μm, its optical transparency tends to decrease.

Also, in order to attach the electromagnetic screen 1 in which the reflective layer 3 is formed on the surface of the base material 2 to the existing objects in a room (such as a window, wall, ceiling, floor, partition, and desk), an aspect may be configured such that an adhesive or glue (or processing for sticking) is applied to at least one of a surface on a side where the reflective layer 3 is formed and a surface on the other side, then a protective layer is provided on a surface of the adhesive or glue, and the resulting electromagnetic screen 1 is rolled (like toilet paper) and can be cut depending on a required length.

FIGS. 4 to 7 exemplifies product patterns (usages) of the electromagnetic screen 1 according to Embodiment 1.

Figure 4:
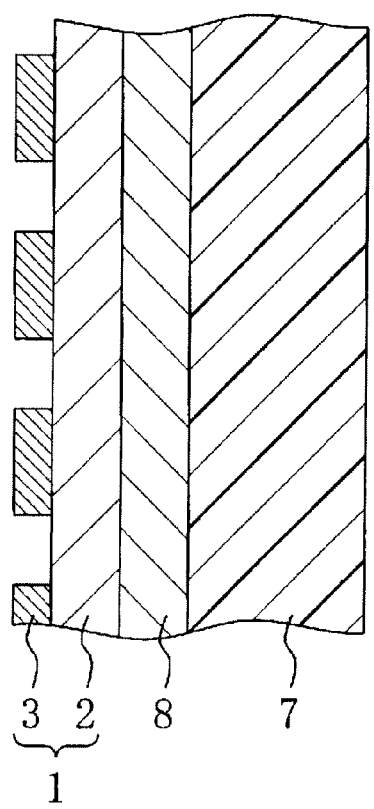
FIG. 4 is a cross-sectional view for a case where a base material 2 side of the electromagnetic screen 1 is made to adhere to glass (windowpane) 7.

FIG. 4 is a cross-sectional view for a case where the base material 2 side of the electromagnetic screen 1 is made to adhere to glass (windowpane) 7. In FIG. 4, the electromagnetic screen 1 adheres to the glass 7 through an adhesive 8 provided on the base material 2 side of the electromagnetic screen 1.

Figure 5:
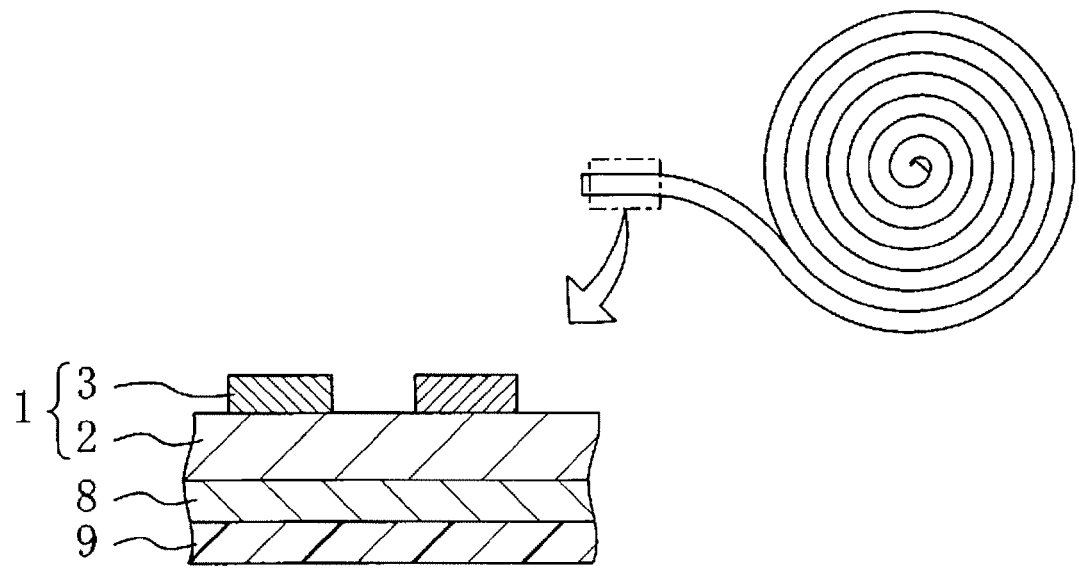
FIG. 5 is a schematic diagram of the electromagnetic screen 1 rolled like toilet paper, in which an adhesive 8 and a protective layer 9 are formed on the base material 2 side of the electromagnetic screen 1.

FIG. 5 is a schematic diagram of the electromagnetic screen 1 rolled like toilet paper, in which the adhesive 8 and a protective layer 9 are formed on the base material 2 side of the electromagnetic screen 1. The electromagnetic screen 1 illustrated in FIG. 5 can be cut and used depending on a required length by peeling the protective layer 9 and then making the shielding body 1 adhere to glass or the like.

Figure 6:
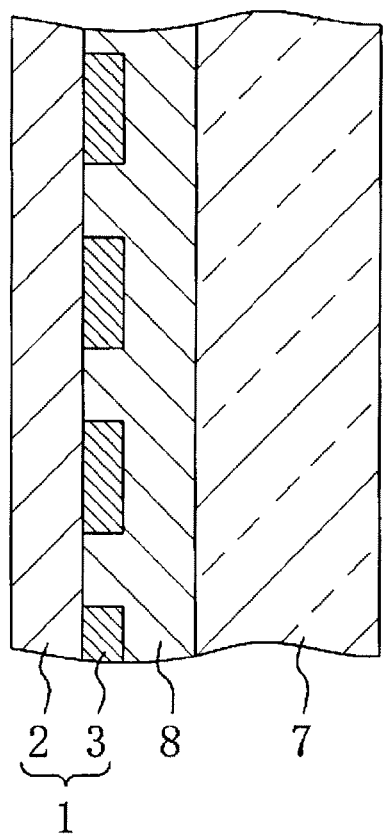
FIG. 6 is a cross-sectional view for a case where a reflective layer 3 side of the electromagnetic screen 1 is made to adhere to the glass (windowpane) 7.

FIG. 6 is a cross-sectional view for a case where the reflective layer 3 side of the electromagnetic screen 1 is made to adhere to the glass (windowpane) 7. In FIG. 6, the electromagnetic screen 1 adheres to the glass 7 through the adhesive 8 provided on the reflective layer 3 side of the electromagnetic screen 1.

Figure 7:
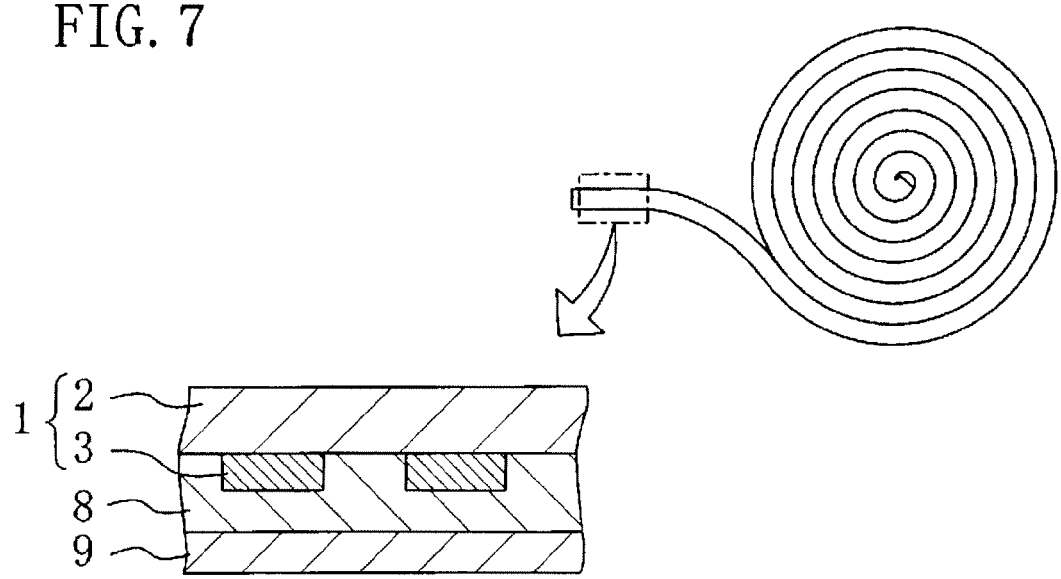
FIG. 7 is a schematic diagram of the electromagnetic screen 1 rolled like toilet paper, in which the adhesive 8 and the protective layer 9 are formed on the reflective layer 3 side of the electromagnetic screen 1.

FIG. 7 is a schematic diagram of the electromagnetic screen 1 rolled like toilet paper, in which the adhesive 8 and the protective layer 9 are formed on the reflective layer 3 side of the electromagnetic screen 1. The electromagnetic screen 1 illustrated in FIG. 7 can be cut and used depending on a required length by peeling the protective layer 9 and then making the shielding body 1 adhere to glass or the like.

The reflective layer 3 formed on the base material 2 consists of a plurality of antennas 4, which are arranged in a predetermined pattern so as to constitute the pattern. In the electromagnetic screen 1 according to Embodiment 1, the reflective layer 3 consists of only the plurality of antennas 4, which respectively have the same shape and size; however, it may partially include antennas each of which has a shape and a size different from those of the antenna 4.

The antenna 4 has frequency selectivity. That is, the antenna 4 selectively reflects an electromagnetic wave having a specific frequency. For this reason, the electromagnetic screen 1 can selectively shield the electromagnetic wave having the specific frequency and transmit the other light therethrough.

In Embodiment 1, the plurality of antennas 4 are arranged on the base material 2 in a matrix form at regular intervals. Also, the plurality of antennas 4 are arranged such that any neighboring antennas 4 do not come into contact with each other. As illustrated in FIG. 3, each of the plurality of antennas 4 has three first element parts 4a and three second element parts 4b. The three first element parts 4a extend outward from the center of the antenna such that any two of the three first element parts 4a form an angle of 120° with each other.

Each of the second element parts 4b is connected to an outer edge of a corresponding one of the first element parts 4a. A length (L1) of the first element part 4a and that (L2) of the second element part 4b may be different from each other, or may be the same as each other. Preferably, the length (L1) of the first element part 4a and that (L2) of the second element part 4b meet a relational expression of $0<L2<2(3)^{1/2}/L1$. This is because if (L2) is equal to or more than $2(3)^{1/2}/L1$, the neighboring second element parts 4b come into contact with each other, resulting in a loss of a desired electromagnetic wave shielding effect. From the perspective of providing a high shielding ratio for the electromagnetic wave having the specific frequency, the length (L2) of the second element part 4b is preferably not less than 0.5 times and not more than 2 times that (L1) of the first element part 4a. More preferably, it is not less than 0.75 times and not more than 2 times.

A width of the first element part 4a and that of the second element part 4b may be different from each other, or may be the same as each other. In Embodiment 1, the width of the first element part 4a and that of the second element part 4b are made to be substantially the same width (L3).

As described above, the antenna 4 has the three second element parts 4b each of which is connected to the outer edge of a corresponding one of the first element parts 4a. For this reason, the antenna 4 has higher frequency selectivity than the conventional Y-shaped linear antenna (linear antenna consisting of only the three first element parts, but not having any second element part). Accordingly, the electromagnetic screen 1 provided with the plurality of antennas 4 can shield the electromagnetic wave having the specific frequency with the higher selectivity.

Also, because the antenna 4 has the second element parts 4b, it is easy to arrange the plurality of antennas 4 such that the second element parts 4b each belonging to a corresponding one of the antennas 4 face to each other. By arranging the plurality of antennas 4 such that the second element parts 4b each belonging to a corresponding one of the antennas 4 face to each other (more preferably, the second element parts 4b closely face to each other), the electromagnetic wave shielding ratio for the electromagnetic wave having the specific frequency can be improved.

From the perspectives of making the second element parts 4b face to each other, and arranging many more antennas 4 per unit area, it is preferable that the second element part 4b is connected at its center to the outer edge of a corresponding one of the first element parts 4a, and the second element part 4b and the first element part 4a form a right angle with each other. Also, the length of the second element part 4b is preferably substantially the same as that of the first element part 4a.

The lengths of the first and second element parts 4a and 4b and a frequency (specific frequency) of an electromagnetic wave to be reflected by the antenna 4 correlate with each other. For this reason, the length of the first element part 4a and that of the second element parts 4b can be appropriately determined depending on a frequency (specific frequency) of an electromagnetic wave to be shielded by the electromagnetic screen 1. For example, if the lengths of the first and second element parts 4a and 4b are the same as each other, increasing the lengths of the first and second element parts 4a and 4b enables the specific frequency to be lowered. On the other hand, decreasing the lengths of the first and second element parts 4a and 4b enables the specific frequency to be raised.

Electromagnetic wave shielding properties of the electromagnetic screen 1 for the case where the lengths (L1) and (L2) of the first and second element parts 4a and 4b are the same as each other (in such a case where (L1) and (L2) are the same, (L1) and (L2) are collectively referred to as an element length L) are described in detail below with reference to FIGS. 8 and 9.

Figure 8:
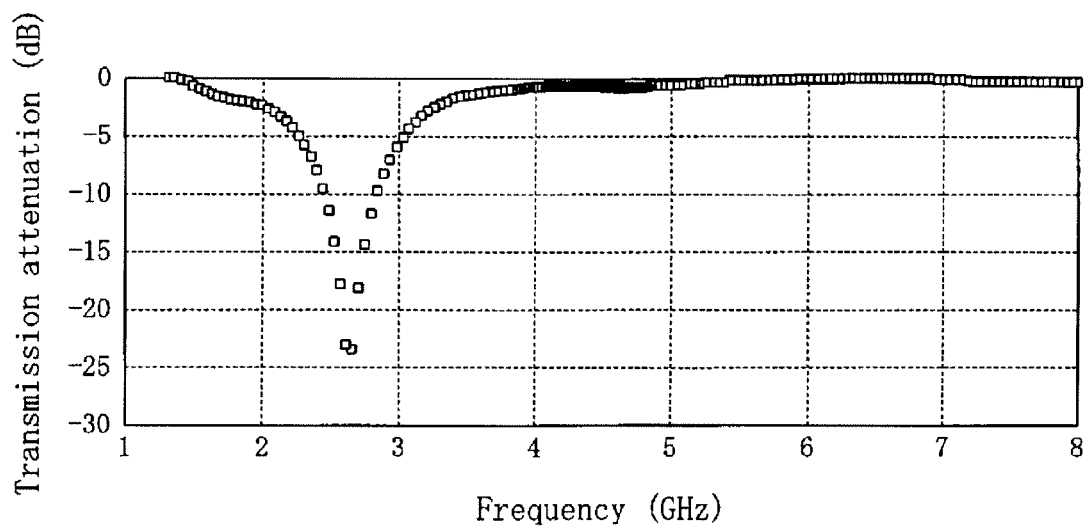
FIG. 8 is a graph representing a relationship between a frequency of an electromagnetic wave and a transmission attenuation of the electromagnetic wave transmitted through the electromagnetic screen 1.

FIG. 8 is a graph representing a relationship between a frequency of an electromagnetic wave and a transmission attenuation of the electromagnetic wave transmitted through the electromagnetic screen 1.

Note that in FIG. 8, the lengths (L1) and (L2) are respectively 10.6 mm, and the width (L3) is 0.7 mm.

As illustrated in FIG. 8, transmittances of electromagnetic waves in a frequency bandwidth around the specific frequency (approximately 2.7 GHz) among those incident on the electromagnetic screen 1 are selectively attenuated. In other words, the electromagnetic screen 1 selectively shields the electromagnetic waves in the frequency bandwidth around the specific frequency among those incident on the electromagnetic screen 1. This is because the reflective layer 3 of the electromagnetic screen 1, specifically each of the plurality of antennas 4 included in the reflective layer 3 selectively reflects the electromagnetic waves in the frequency bandwidth around the specific frequency among the incident electromagnetic waves. A frequency of an electromagnetic wave reflected by the antenna 4 is determined by the length (L1=L) of the first element part 4a and that (L2=L) of the second element part 4b.

Figure 9:
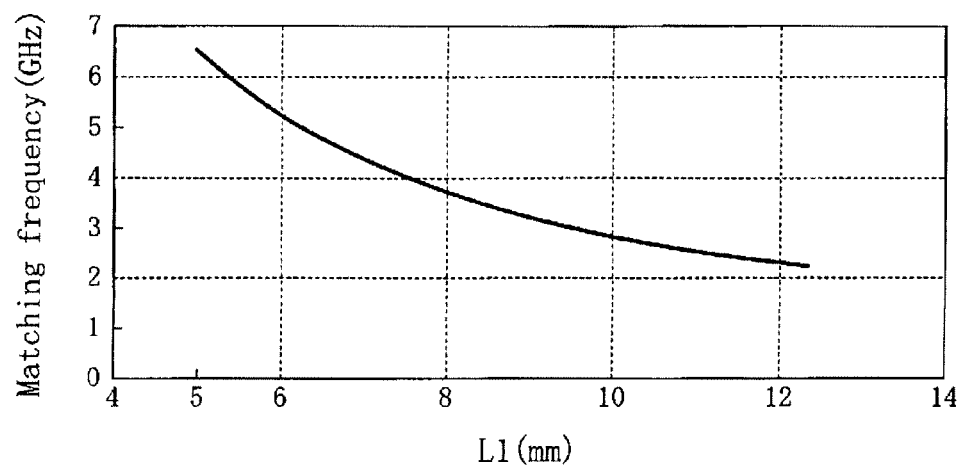
FIG. 9 is a graph representing a relationship between an element length L and a frequency of an electromagnetic wave reflected by the antenna 4.

FIG. 9 is a graph representing a relationship between the element length L and the frequency of the electromagnetic wave reflected by the antenna 4.

As illustrated in FIG. 9, with increasing the element length L, the frequency of the electromagnetic wave reflected by the antenna 4 is lowered. In other words, with increasing the element length L, a wavelength of the electromagnetic wave reflected by the antenna 4 becomes longer. Conversely, with decreasing the element length L, the frequency of the electromagnetic wave reflected by the antenna 4 is raised (wavelength becomes shorter).

On the other hand, the frequency of the reflected electromagnetic wave does not significantly correlate with the width L3. That is, the frequency of the reflected electromagnetic wave is determined mainly by the element length L. Consequently, based on the relationship between the element length L and the selected frequency as illustrated in FIG. 9, the element length L can be calculated and determined from a frequency (specific frequency) of an electromagnetic wave the antenna 4 is made to reflect. For example, if the electromagnetic screen 1 for shielding an electromagnetic wave having a frequency of 5 GHz is fabricated, it turns out from FIG. 9 that it is only necessary to make the element length L to be approximately 6 mm.

Alternatively, the specific frequency may be adjusted by, for example, adjusting the length (L2) of the second element part 4b while fixing the length (L1) of the first element part 4a constant. Specifically, increasing the length (L2) of the second element part 4b enables the specific frequency to be lowered. Conversely, decreasing the length (L2) of the second element part 4b enables the specific frequency to be raised.

For example, in the conventional Y-shaped linear antenna (antenna not having any second element part but consisting of only the first element parts), only adjusting the length (L1) of the first element part enables the specific frequency to be adjusted. Contrarily, in the electromagnetic screen 1 according to Embodiment 1, the specific frequency can be adjusted by adjusting both of the lengths (L1) and (L2) of the first and second element parts 4a and 4b, or alternatively, by adjusting a ratio of the length (L2) of the second element part 4b to that (L1) of the first element part 4a. Accordingly, the electromagnetic screen 1 having a wide design margin can be provided.

In Embodiment 1, the antenna 4 is formed from an electrically conductive material. That is, the antenna 4 is electrically conductive. Electromagnetic wave reflectance of the antenna 4 (electromagnetic wave shielding ratio of the electromagnetic screen 1) for the electromagnetic wave having the specific frequency correlates with electrical conductivity of the antenna 4. Specifically, the higher the electrical conductivity of the antenna 4 (smaller the electrical resistance of the antenna 4), the higher the electromagnetic wave reflectance of the antenna 4 (electromagnetic wave shielding ratio of the electromagnetic screen 1) for the electromagnetic wave having the specific frequency. For this reason, by increasing the electrical conductivity of the antenna 4, the electromagnetic wave reflectance of the antenna 4 (electromagnetic wave shielding ratio of the electromagnetic screen 1) for the electromagnetic wave having the specific frequency can be increased.

The electrically conductive material includes aluminum, silver, copper, gold, platinum, iron, carbon, graphite, indium tin oxide (ITO), and indium zinc oxide (IZO), and a mixture or alloy of them. Preferably, the antenna 4 includes at least any of copper, aluminum, and silver. Copper, aluminum, and silver have relatively low electrical resistance, and are low-cost among many electrically conductive materials, so that such a configuration can provide the electromagnetic screen 1 having a high electromagnetic wave shielding property at low cost. From the perspective of providing a higher electromagnetic wave shielding property and low cost, silver is particularly preferable among the above electrically conductive materials.

The antenna 4 may consist of an electrically conductive film made of the electrical conductive material, and an oxidation protective film coating the electrically conductive film.

Alternatively, the antenna 4 may be configured to include fine particles of the electrically conductive material such as copper, aluminum, or silver. For example, the antenna 4 may be fabricated by uniformly coating paste (which may be referred to as "electrically conductive paste" below), in which a binder is made to contain a powdered electrically conductive material, onto the base material 2 in a predetermined pattern, and then drying it. Specifically, by forming the paste in the predetermined pattern and then drying it, for example, for not less than 10 minutes and not more than 5 hours in an atmosphere of not less than 100° C. and not more than 200° C., the antenna 4 may be fabricated.

The electrically conductive paste for fabricating the antenna 4 may be polyester resin in which the powdered electrically conductive material (e.g., silver) is dispersed and mixed. In this case, a content of the electrically conductive material is preferably not less than 40 wt. % and not more than 80 wt. %. More preferably, the content of the electrically conductive material is not less than 50 wt. % and not more than 70 wt. %. If the content of the electrically conductive material is less than 40 wt. %, the conductivity of the antenna 4 tends to decrease. On the other hand, if the content of the electrically conductive material is more than 80 wt. %, performing the uniform dispersion and mixture in the resin tends to be difficult. Note that the polyester resin plays a role as a glue for gluing the electrically conductive material and the base material 2.

In addition, a thickness of the antenna 4 is preferably not less than 10 μm and not more than 20 μm. If the thickness of the antenna 4 is less than 10 μm, the conductivity of the antenna 4 tends to decrease. On the other hand, if the thickness of the antenna 4 is more than 20 μm, formability of the antenna 4 tends to be reduced.

In the present invention, a method for forming the antenna 4 is not limited to the above-described method, but the antenna 4 may be formed in a different manner. For example, the antenna 4 may be formed in such a manner that an electrically conductive film (e.g., aluminum film, silver film, etc.) is deposited onto the base material 2 by a deposition method such as evaporation, sputtering, or chemical vapor deposition (CVD), and then patterned into a predetermined shape and size by a patterning method such as photolithography. Alternatively, the antenna 4 may be formed by sticking or attaching to the base material 2 a thin film such as aluminum having been patterned into the predetermined pattern and size. Further, the antenna 4 may be formed by, for example, silk printing, pattern compression bonding, etching, sputtering, evaporation (e.g., chemical vapor deposition (CVD)), mist coating, embedding by inserting a pattern, etc.

As above, the electromagnetic screen 1 according to Embodiment 1 has been described in detail; however, the shape and size of the electromagnetic screen 1 are not limited at all. The electromagnetic screen 1 may be in a small square shape having a side length of a few millimeters, or a large square shape having a side length of a few meters or more.

Also, the electromagnetic screen 1 may be in any shape such as a triangle, quadrangle (rectangle, square), polygon, circle, or oval in plan view.

Further, the number of the antennas 4 included per unit area of the electromagnetic screen 1 is not limited at all. The number of the antennas 4 included per unit area of the electromagnetic screen 1 may be appropriately varied depending on an application of the electromagnetic screen 1, or the like. By increasing the number of the antennas 4 included per unit area of the electromagnetic screen 1, a higher electromagnetic wave shielding property can be provided.

Modified Example

Figure 10A:
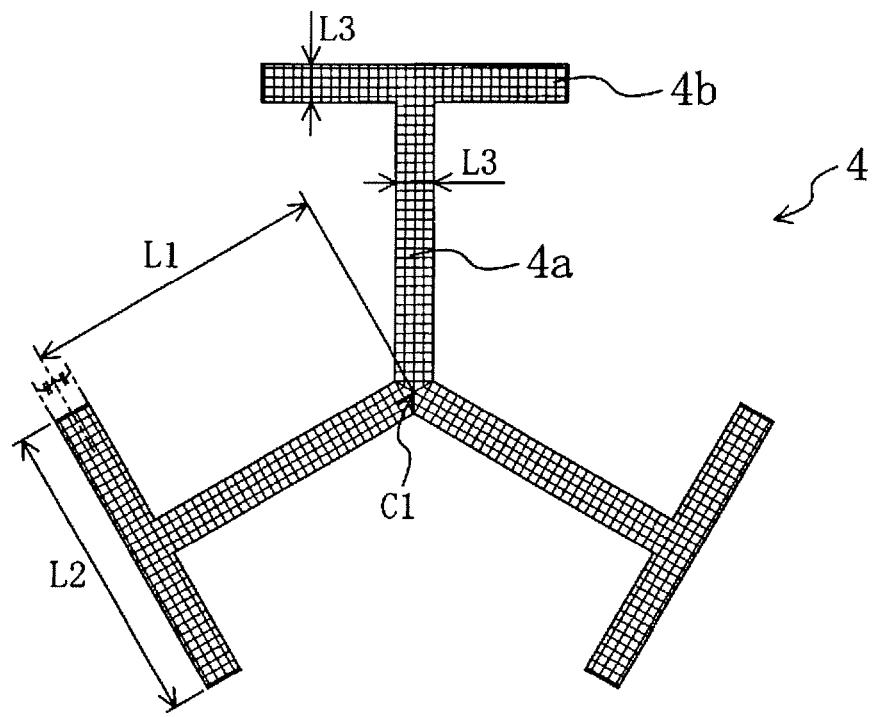
FIG. 10 is a plan view illustrating a modified example of the antenna 4.
Figure 10B:
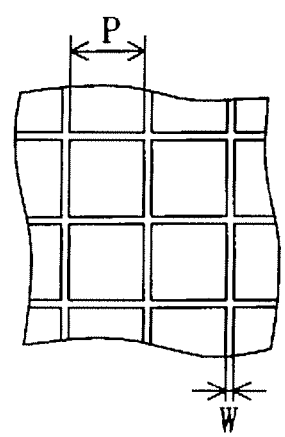

FIG. 10 is a plan view illustrating a configuration of the antenna 4 in the modified example (modified example of the above Embodiment 1). Specifically, FIG. 10(*a*) is a plan view illustrating an overall shape of the antenna 4 in the modified example. FIG. 10(*b*) is a partially enlarged plan view illustrating a partial shape of the antenna 4.

As illustrated in FIG. 10, the antenna 4 may be formed of a metal film (preferably, a metal thin film) having openings. This configuration enables the antenna 4 to have a certain degree of optical transparency, and thereby to be less conspicuous. Accordingly, an electromagnetic screen unlikely to block view can be provided. From the perspective of a good view, an area ratio of the metal film to the antenna 4 is preferably not less than 2.5% and not more than 30%.

If the metal film constituting the antenna 4 is in a mesh-like shape in plan view, a line width (W) and a line pitch (P) are preferably not less than 5 μm and not more than 70 μm, and not less than 50 μm and not more than 400 μm, respectively, and more preferably not less than 8 μm and not more than 30 μm, and not less than 100 μm and not more than 300 μm, respectively, based on a relationship between the electrical conductivity (electromagnetic wave shielding property) and an opening ratio (optical transparency).

If the line width (W) is less than 5 μm, the electrical conductivity (electromagnetic wave shielding property) tends to decrease. On the other hand, if the line width (W) is more than 70 μm, the opening ratio (optical transparency) tends to decrease.

Also, if the pitch (P) is less than 50 μm, the opening ratio (optical transparency) tends to decrease. On the other hand, if the pitch (P) is more than 400 μm, the electrical conductivity (electromagnetic wave shielding property) tends to decrease.

Further, from the perspective of manufacturability of the electromagnetic screen 1 in addition to those of suppressing discomfort caused to people by the arrangement of the antennas 4 (perspective of optical transparency) and of the electrical conductivity (perspective of electromagnetic wave shielding property), both of the line width (W) and the pitch (P) are preferably made larger. Specifically, the line width (W) is preferably made to be not less than 50 µm and not more than 70 µm, and the pitch (P) preferably made to be not less than 300 µm and not more than 400 µm.

In addition, in this modified example, the metal film constituting the antenna 4 is formed into a square lattice; however, it may be a metal film formed into a mesh-like shape in plan view, such as a lattice shape in plan view (triangle lattice, hexagonal lattice, Collins lattice, etc.). Alternatively, it may be a metal film formed with a plurality of micropores having a circular shape (or oval or polygonal shape) in plan view.

Embodiment 2

FIG. 11 is a plan view of an electromagnetic screen 10 according to Embodiment 2.

Figure 12:
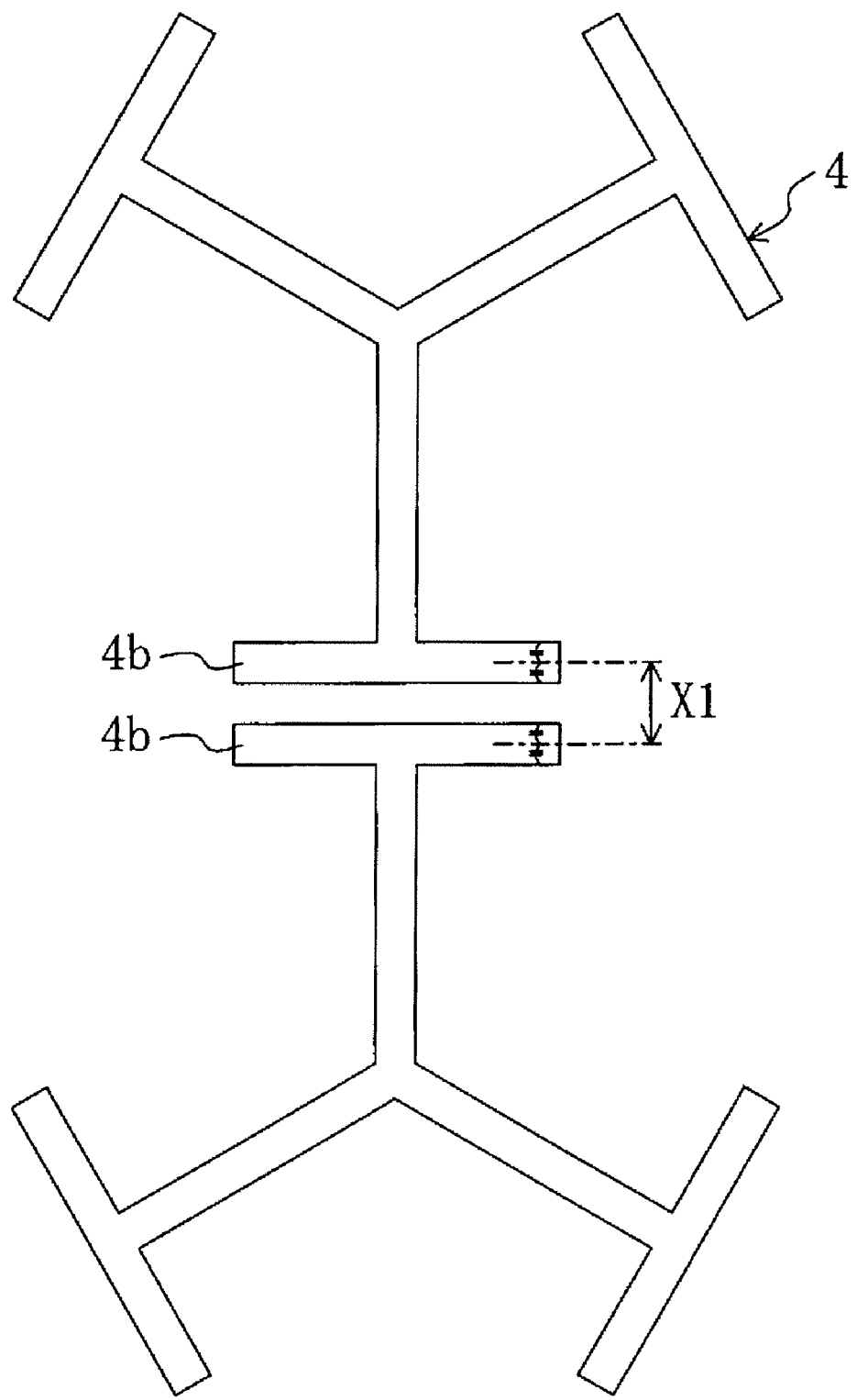
FIG. 12 is a partially enlarged plan view of the electromagnetic screen 10.

FIG. 12 is a partially enlarged plan view of the electromagnetic screen 10.

The electromagnetic screen 10 according to Embodiment 2 has a configuration same as that of the electromagnetic screen 1 according to Embodiment 1, except for the arrangement of the antennas 4 in the reflective layer 3. The arrangement of the antenna 4 in Embodiment 2 is described in detail below with reference to FIGS. 11 and 12. Note that in the following description of Embodiment 2, FIG. 1 is referenced in common with Embodiment 1, and a component having substantially the same function is represented by the same reference numeral as in Embodiment 1, of which description is omitted.

In Embodiment 2, a plurality of antennas 4 constitute a plurality of antenna units 5a each of which is comprised of a pair of the antennas 4 placed such that two second element parts 4b each belonging to a corresponding one of the pair of the antennas 4 face to each other. Also, the antenna units 5a further constitute a plurality of hexagonal antenna assemblies 5 in each of which the antenna units 5a are placed and continuously developed in two dimensions such that the second element parts 4b each belonging to a corresponding one of the antenna units 5a face to each other. Each of the antenna assemblies 5 is comprised of three of the antenna units 5a circularly arranged such that the second element parts 4b respectively belonging to any two of the three antenna units 5a face to each other. In other words, the antenna assembly 5 is comprised of six of the antennas 4 circularly arranged such that the second element parts 4b respectively belonging to any neighboring two of the six antennas 4 face to each other.

In the electromagnetic screen 10 according to Embodiment 2, the plurality of antenna assemblies 5 are arrayed in a matrix form at predetermined intervals.

From the perspective of providing a constant electromagnetic wave shielding property for an incident electromagnetic wave having various incident angles, the antenna assembly 5 is preferably in a hexagonal shape (more preferably, in a regular hexagonal shape). Accordingly, the first and second element parts 4a and 4b preferably form a right angle with each other. Also, it is preferable that the second element part 4b is connected at its center to the first element part 4a.

In Embodiment 2, twelve of the eighteen second element parts 4b constituting the antenna assembly 5 are provided such that the second element parts 4b respectively belonging to any neighboring two of the twelve second element parts 4b face to each other in substantially parallel. By configuring the antennas 4 such that a relatively large number of pairs of the second element parts 4b facing to each other are present as above, the electromagnetic wave reflectance (electromagnetic wave shielding property) of the antenna 4 for the electromagnetic wave having the specific frequency can be improved. Consequently, the electromagnetic screen 10 having a high electromagnetic wave shielding property for the electromagnetic wave having the specific frequency can be provided.

In addition, with decreasing a distance (X1) between the second element parts 4b facing to each other, the electromagnetic wave reflectance of the electromagnetic screen 10 increases. Specifically, the distance (X1) between the second element parts 4b facing to each other (see FIG. 12) is preferably not less than 0.4 mm and not more than 3 mm. More preferably, it ranges from not less than 0.6 mm to not more than 1 mm. If the distance X1 is made to be less than 0.4 mm, the second element parts 4b facing to each other may undesirably come into contact with each other. On the other hand, if the distance X is more than 3 mm, the electromagnetic wave shielding property tends to decrease.

In addition, also in Embodiment 2, the antenna 4 may be formed of a metal film (preferably, a metal thin film) having openings, for example, a mesh shaped metal film, as in the above modified example.

Embodiment 3

Figure 13:
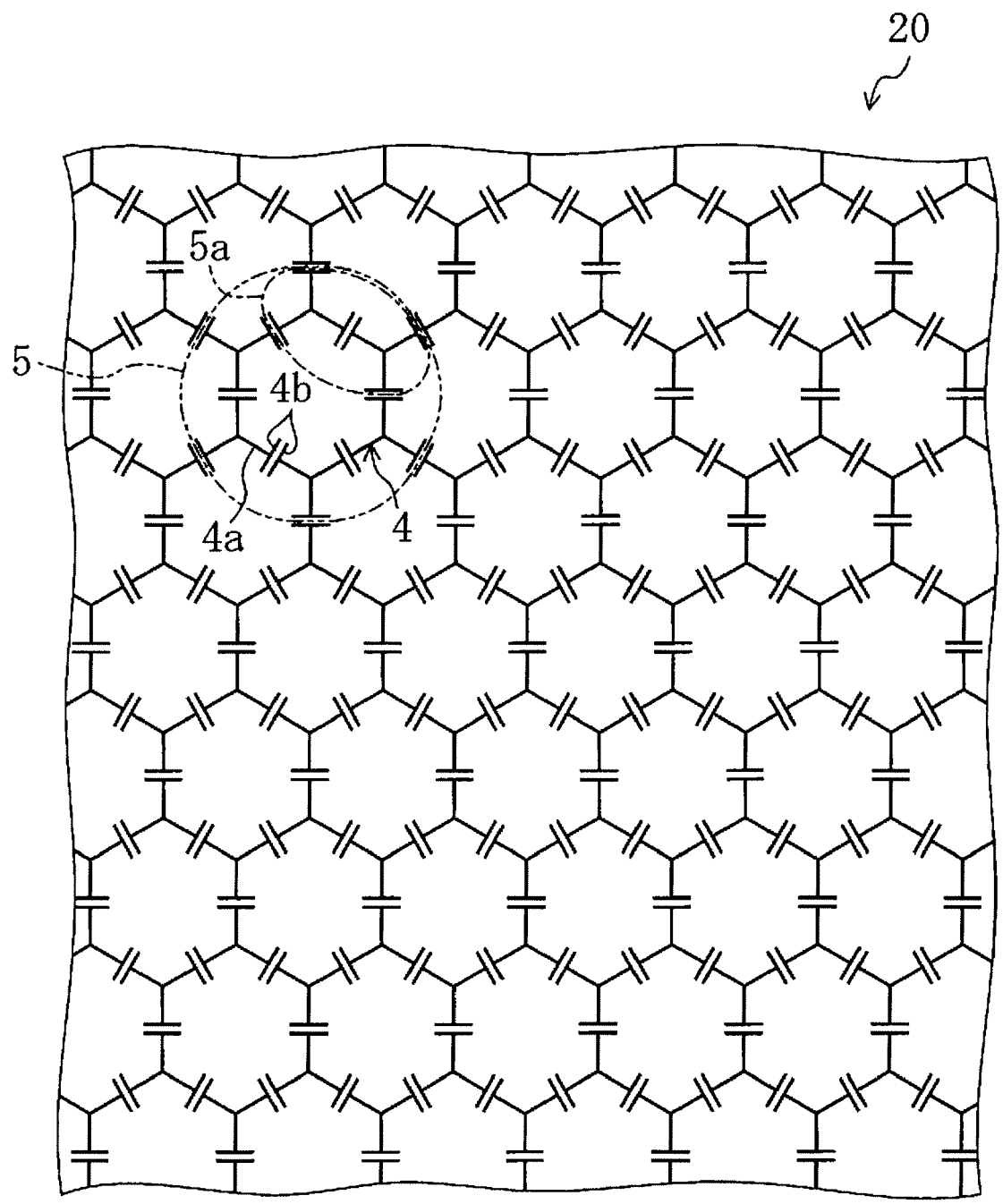
FIG. 13 is a plan view of an electromagnetic screen 20 according to Embodiment 3.

FIG. 13 is a plan view of an electromagnetic screen 20 according to Embodiment 3.

The electromagnetic screen 20 according to Embodiment 3 has a configuration same as those of the electromagnetic wave shielding bodies 1 and 10 respectively according to Embodiments 1 and 2, except for the arrangement of the antennas 4 in the reflective layer 3. The arrangement of the antennas 4 in Embodiment 3 is described in detail below with reference to the drawing. Note that in the following description of Embodiment 3, FIG. 1 is referenced in common with Embodiment 1, and a component having substantially the same function is represented by the same reference numeral as in Embodiment 1 or 2, of which description is omitted.

In the electromagnetic screen 20 according to Embodiment 3, the antenna assemblies 5 are arranged such that many more pairs of second element parts 4b facing to each other are present (arranged in what is called a honeycomb shape). For this reason, in Embodiment 3, almost any second element part 4b faces to its neighboring second element part 4b.

By arranging the antennas 4 as above, the number of pairs of the second element parts 4b provided so as to face to each other can be further increased than in Embodiment 2. For this reason, the electromagnetic screen 20 according to Embodiment 3 has the electromagnetic wave reflectance much higher than the electromagnetic screen 10 according to Embodiment 2.

Also, the electromagnetic screen 20 according to Embodiment 3 has the frequency selectivity much higher than the electromagnetic screen 10 according to Embodiment 2 as described below. Accordingly, the electromagnetic screen 20 is preferable for creating the current electromagnetic wave environment where a working frequency range is about to reach saturation.

The reason why the electromagnetic screen 20 has the higher frequency selectivity is specifically described below with reference to FIGS. 14 to 18.

Figure 14:
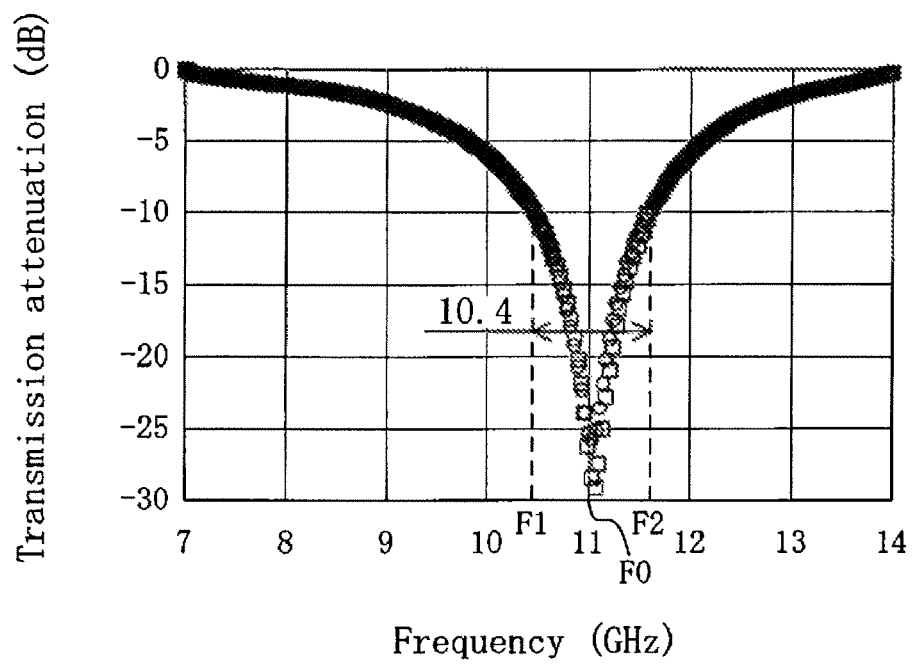
FIG. 14 is a graph illustrating an electromagnetic wave shielding property of the electromagnetic screen 20 according to Embodiment 3.

FIG. 14 is a graph illustrating the electromagnetic wave shielding property of the electromagnetic screen 20 according to Embodiment 3.

As illustrated in FIG. 14, the 10 dB bandwidth [(F2−F1)/F0(%)] of the electromagnetic screen 20 according to Embodiment 3 is as small as 10.4%. Thus, the electromagnetic screen 20 has the very high frequency selectivity. Note that F0 is the matching frequency.

On the other hand, the conventional electromagnetic screen has lower frequency selectivity compared with the electromagnetic screen 20 according to Embodiment 3.

Figure 15:
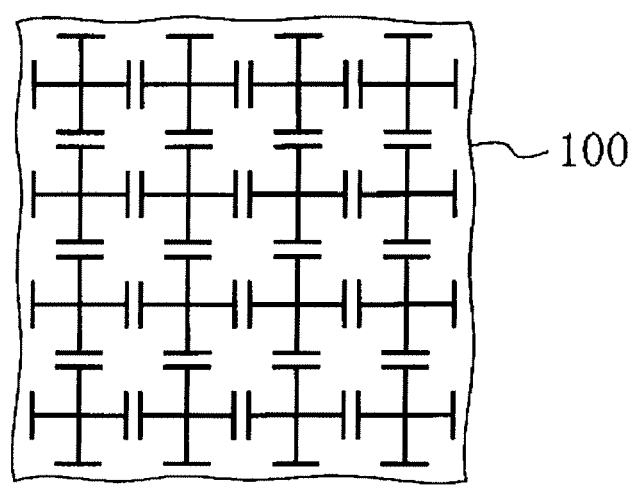
FIG. 15 is a plan view of a conventional electromagnetic screen 100.

FIG. 15 is a plan view of a conventional electromagnetic screen 100.

Figure 16:
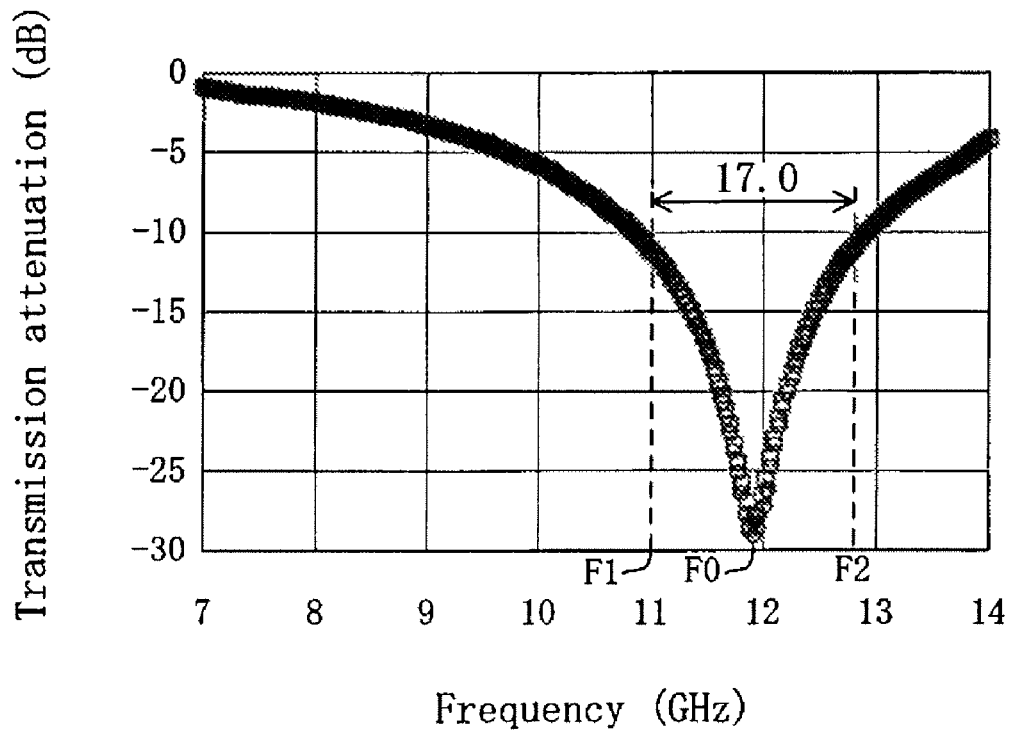
FIG. 16 is a graph illustrating the electromagnetic wave shielding property of the electromagnetic screen 100.

FIG. 16 is a graph illustrating the electromagnetic wave shielding property of the electromagnetic screen 100.

Figure 17:
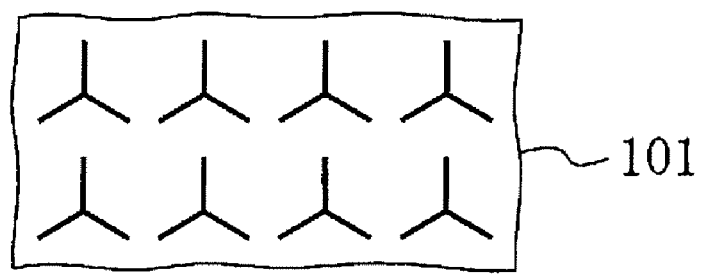
FIG. 17 is a plan view of another conventional electromagnetic screen 200.

FIG. 17 is a plan view of another conventional electromagnetic screen 101.

Figure 18:
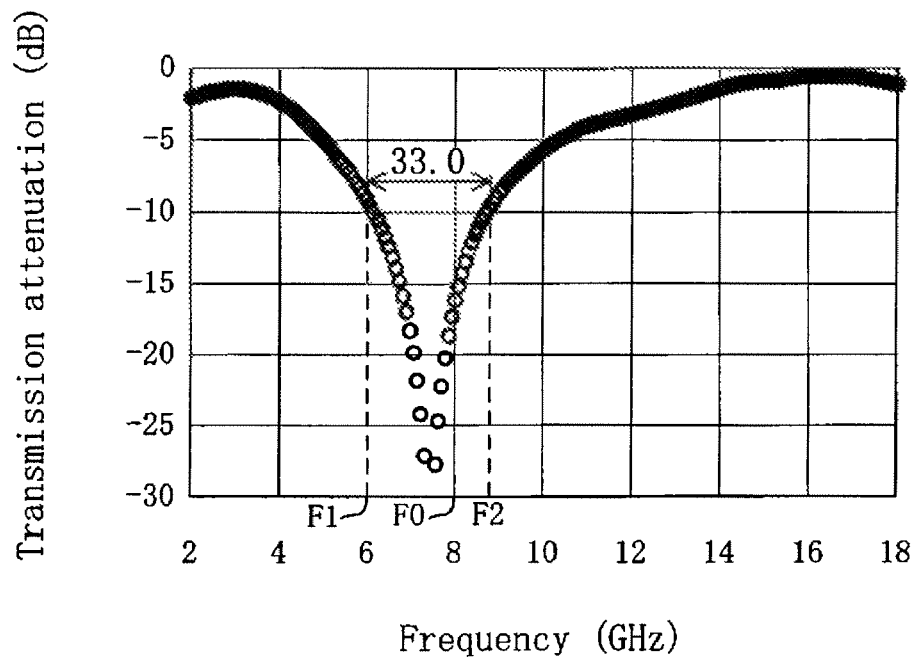
FIG. 18 is a graph illustrating the electromagnetic wave shielding property of the electromagnetic screen 200.

FIG. 18 is a graph illustrating the electromagnetic wave shielding property of the electromagnetic screen 101.

The conventional electromagnetic screen 100 comprises a plurality of antennas of what is called "Jerusalem cross type". The 10 dB bandwidth [(F2−F1)/F0(%)] of the electromagnetic screen 100 with respect to the matching frequency (F0) is as relatively large as 17.0% as illustrated in FIG. 16, compared with that of the electromagnetic screen 20 according to Embodiment 3.

Further, the 10 dB bandwidth [(F2−F1)/F0(%)] of the conventional electromagnetic screen 101 comprising a plurality of Y-shaped antennas is also as relatively large as 33.0% as illustrated in FIG. 18, compared with that of the electromagnetic screen 20 according to Embodiment 3.

The conventional electromagnetic wave shielding bodies 100 and 101 respectively having lower frequency selectivity as described may also shield electromagnetic waves other than that (those) having an intended specific frequency (range). For this reason, if the conventional electromagnetic screen 100 or 101 is used, the electromagnetic wave environment for the electromagnetic waves other than that having the specific frequency may be deteriorated. On the other hand, the electromagnetic screen 20 according to Embodiment 3 has, as described above, the smaller 10 dB bandwidth (very high frequency selectivity), and therefore can preferably shield the electromagnetic wave(s) having the specific frequency (bandwidth), as well as preferably transmitting therethrough the electromagnetic waves other than that (those) having the specific frequency (range).

Note that the electromagnetic screen 20 according to the present invention has the matching frequency different from those of the conventional ones 100 and 101; however, the 10 dB bandwidth is independent of the matching frequency.

Also in Embodiment 3, the antenna 4 may be formed of a metal film (preferably, a metal thin film) having openings, for example, a mesh shaped metal film, as in the above modified example.

Embodiment 4

In each of the above Embodiments 1 to 3, the electromagnetic screen has been described as an application example of the present invention. However, the electromagnetic screen according to the present invention is not limited to the above Embodiments at all. The electromagnetic screen according to the present invention may be configured such that the reflective layer 3 including the plurality of antennas 4 is provided inside the electromagnetic screen. In Embodiment 4, the electromagnetic screen inside which the reflective layer 3 including the plurality of antennas 4 is provided is described with reference to FIG. 19. Note that in the following description of Embodiment 4, a component having substantially the same function is represented by the same reference numeral as in Embodiment 1, of which description is omitted.

Figure 19:
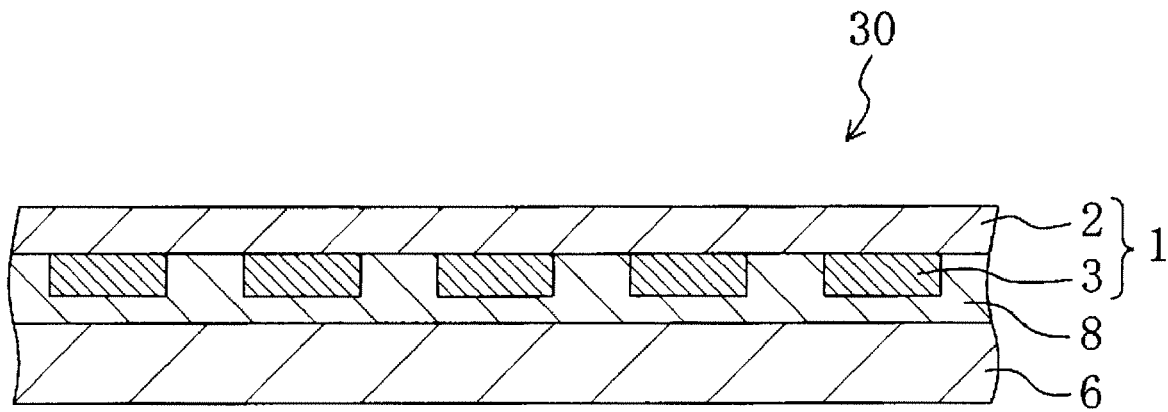
FIG. 19 is a cross-sectional view illustrating a configuration of an electromagnetic screen (electromagnetic wave shielding plate) 30 according to Embodiment 4.

FIG. 19 is a cross-sectional view illustrating a configuration of the electromagnetic screen (electromagnetic wave shielding plate) 30 according to Embodiment 4.

The electromagnetic wave shielding plate 30 according to Embodiment 4 comprises the electromagnetic screen 1 according to Embodiment 1 and a plate-like body 6. Specifically, the electromagnetic screen 1 is stacked on the plate-like body 6 through the adhesive 8 such that the antennas 4 face to the plate-like body 6.

The plate-like body 6 is not limited at all. The plate-like body 6 may be, for example, a wooden plate, a glass plate, or the like.

The electromagnetic screen 1 is attached or glued to the plate-like body 6 with use of the adhesive (glue) 8. The adhesive is preferably a transparent adhesive such as an acrylic adhesive from the perspective of optical transparency. Also, as the glue, a transparent glue is preferable, such as an acrylic glue. A layer thickness of the adhesive or glue is preferably not less than 10 µm and not more than 60 µm from the perspectives of adhesiveness (gluing property), electromagnetic wave shielding property, and optical transparency. More preferably, it ranges from not less than 20 µm to not more than 50 µm.

Even if the electromagnetic screen 1 is attached or glued to the plate-like body 6 such as glass through the adhesive (glue) 8 as in Embodiment 4, the electromagnetic wave having the specific frequency is selectively reflected by the antennas 4.

However, the frequency (specific frequency) of the electromagnetic wave reflected (shielded) by the antennas 4 is different between cases where one side of the antenna 4 comes into contact with air as in Embodiment 1 and where both sides of the antenna 4 come into contact with solid materials such as the base material 2 and the plate-like body 6 as in Embodiment 4, even if a shape and size of and a material for the antenna 4 are the same between the cases.

Figure 20:
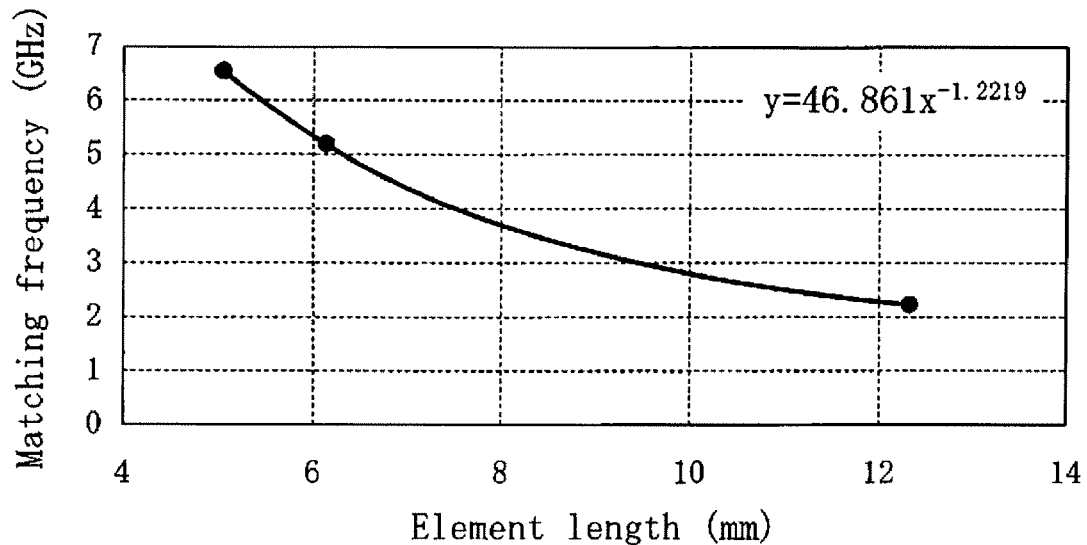
FIG. 20 is a graph illustrating a matching frequency of the electromagnetic screen 1 in a condition where it is not brought into contact with a plate-like body 6 made of glass.

FIG. 20 is a graph illustrating the matching frequency of the electromagnetic screen 1 in a condition where it is not brought into contact with the plate-like body 6 made of glass.

Figure 21:
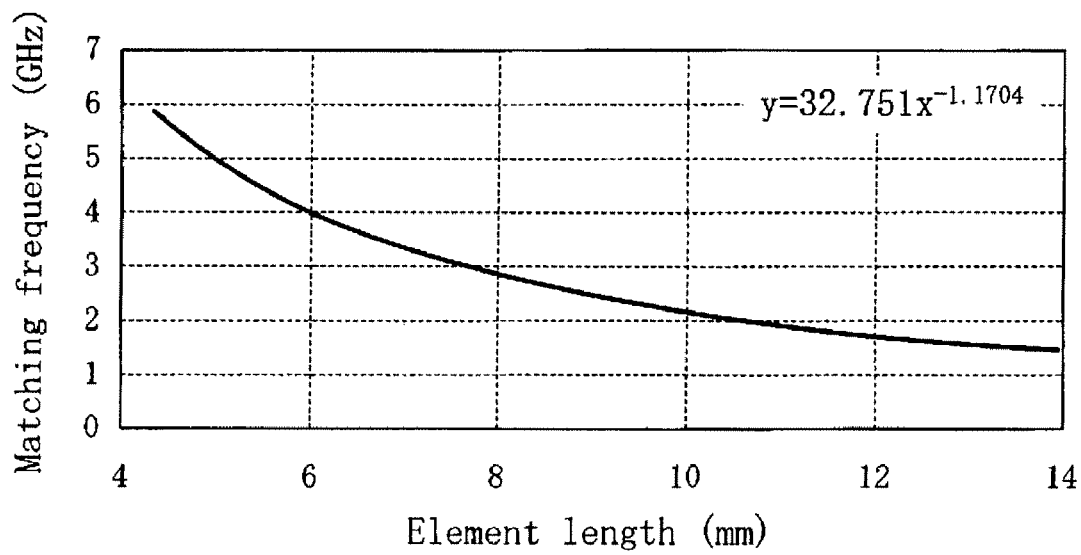
FIG. 21 is a graph illustrating the matching frequency of the electromagnetic screen 1 in a condition where it is brought into contact with the plate-like body 6 made of glass on the reflective layer 3 side.

FIG. 21 is a graph illustrating the matching frequency of the electromagnetic screen 1 in a condition where it is brought into contact with the plate-like body 6 made of glass on the reflective layer 3 side.

In addition, relational expressions shown in FIGS. 20 and 21 are regression expressions respectively for two sets of obtained matching frequency data. Also, the two sets of data in FIGS. 20 and 21 are for a case where the electromagnetic screen 1 has the antennas 4 in each of which the length (L1) of the first element part 4a and that (L2) of the second element part 4b are the same. The "element length" shown in FIG. 20 or 21 refers to the length (L1) of the first element part 4a (=length (L2) of the second element part 4b).

As illustrated in FIGS. 20 and 21, if the electromagnetic screen 1 is made to adhere to the plate-like body 6 made of glass on the reflective layer 3 side, a relationship between the element length and the matching frequency is varied compared with the case where the reflective layer 3 is in contact with air. Specifically, if the electromagnetic screen 1 is attached to the plate-like body 6 made of glass on the reflective layer 3 side, a frequency of an electromagnetic wave reflected (shielded) by the antennas 4 is lowered compared with the case where the reflective layer 3 is in contact with air.

In addition, also in Embodiment 4, the antenna 4 may be formed of a metal film (preferably, a metal thin film) having openings, for example, a mesh shaped metal film, as in the above modified example.

As above, the electromagnetic screen having the antennas 4 of only one type has been described as an example in each of the above Embodiments 1 to 4. However, the electromagnetic screen according to the present invention may have the antennas 4 of a plurality of types (two or more types). An example of an electromagnetic screen having antennas of two types is described in detail below with reference to the drawings.

Embodiment 5

Figure 22:
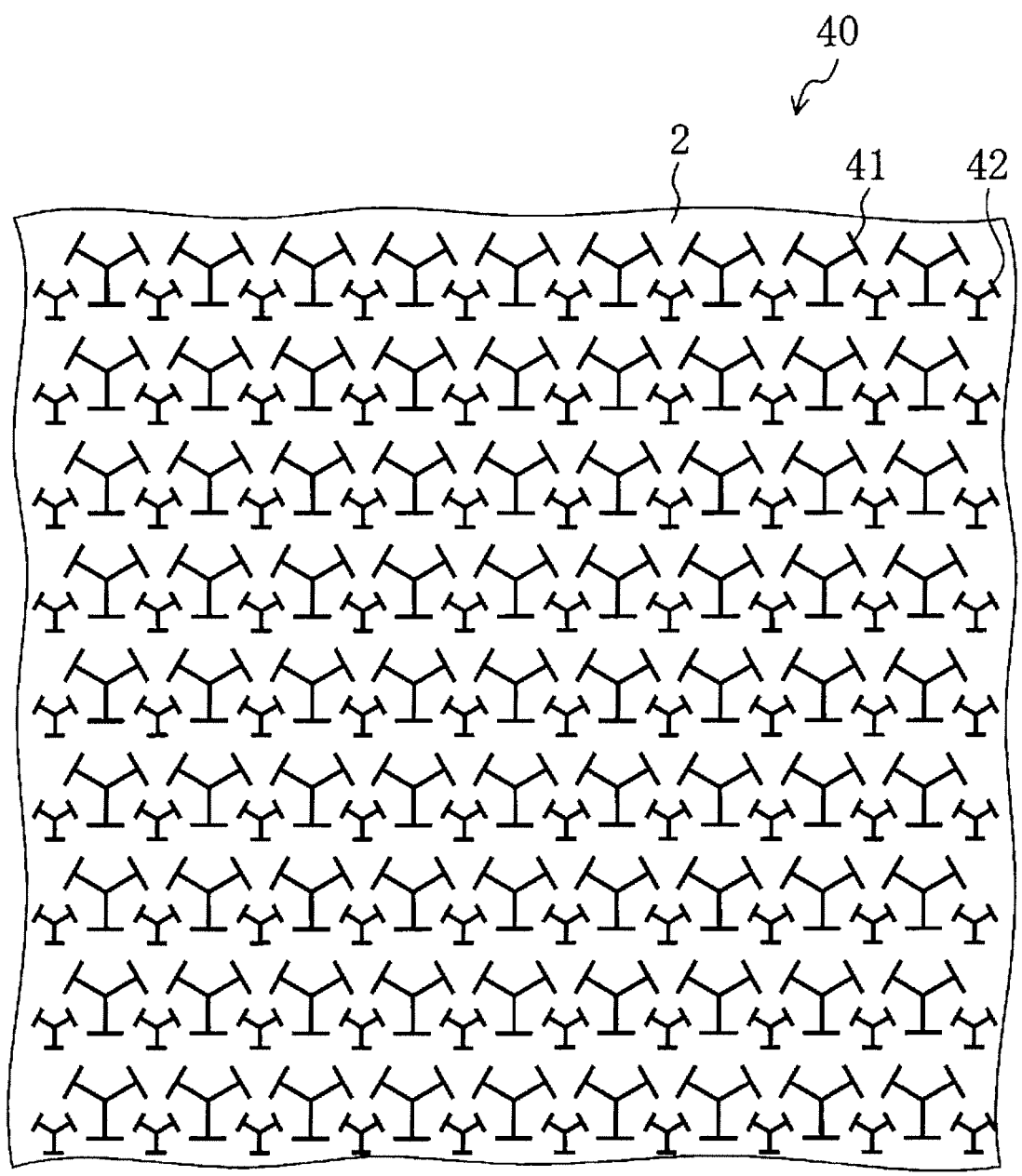
FIG. 22 is a plan view of an electromagnetic screen 40.

FIG. 22 is a plan view of an electromagnetic screen 40.

Figure 23:
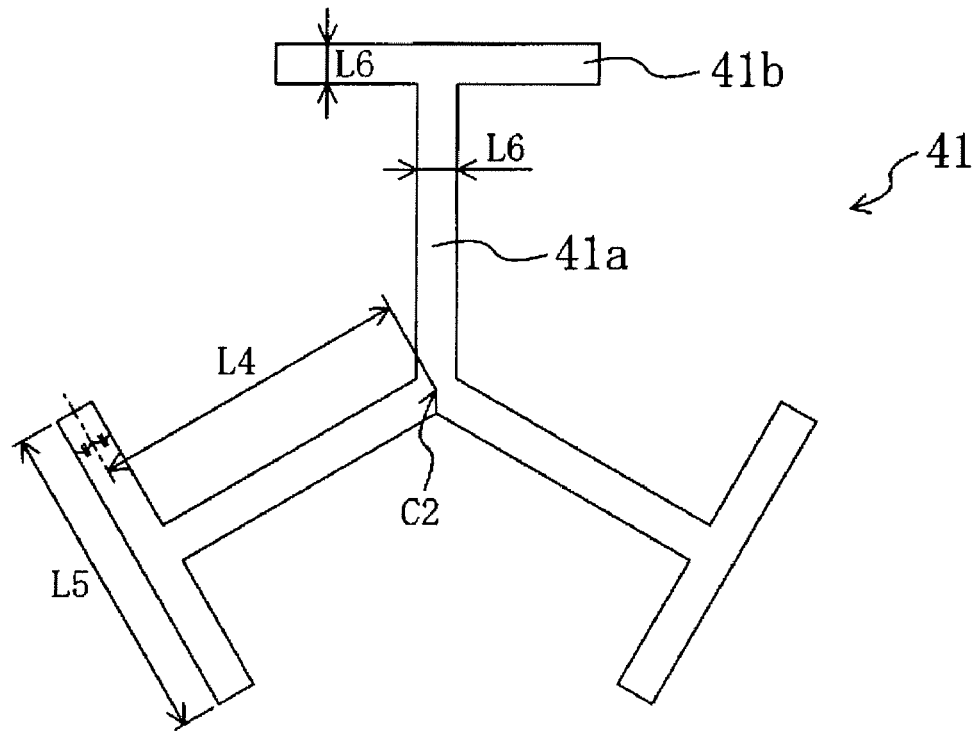
FIG. 23 is a plan view illustrating a configuration of a first antenna 41.

FIG. 23 is a plan view illustrating a configuration of a first antenna 41.

Figure 24:
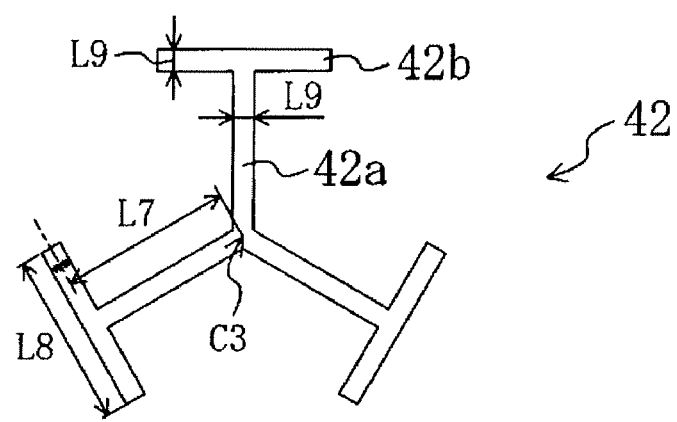
FIG. 24 is a plan view illustrating a configuration of a second antenna 42.

FIG. 24 is a plan view illustrating a configuration of a second antenna 42.

The electromagnetic screen 40 according to Embodiment 5 has a configuration same as that of the electromagnetic screen 1 according to Embodiment 1, except that the reflective layer 3 consists of antennas of two types, i.e., the first antennas 41 and the second antennas 42. The reflective layer 3 in Embodiment 5 is described in detail below with reference to FIGS. 22 to 27. Note that in the following description of Embodiment 5, FIG. 1 is referenced in common with Embodiment 1, and a component having substantially the same function is represented by the same reference numeral as in Embodiment 1, of which description is omitted.

In Embodiment 5, the reflective layer 3 comprises a plurality of first antennas 41 and a plurality of second antennas 42 that are arranged to configure a pattern and different in size from each other. The first and second antennas 41 and 42 may have similar figures.

In addition, as in the above modified example, each of the first and second antennas 41 and 42 may be formed of a metal film (preferably, a metal thin film) having openings, for example, a mesh shaped metal film.

Also, in the electromagnetic screen 40 according to Embodiment 5, the reflective layer 3 consists of only the first and second antennas 41 and 42; however, the present invention is not limited to this configuration at all. For example, the reflective layer 3 may include a pattern shape different from those of the first and second antennas 41 and 42.

The plurality of first antennas 41 and the plurality of second antennas 42 are arrayed on the base material 2 in a matrix form at regular intervals such that each of the first antennas 41 and each of the second antennas 42 do not interfere with each other. Each of the first and second antennas 41 and 42 has the frequency selectivity. Specifically, the first antenna 41 reflects an electromagnetic wave having a first frequency, and the second antenna 42 reflects an electromagnetic wave having a second frequency. For this reason, the electromagnetic screen 40 according to Embodiment 5 can selectively shield the electromagnetic waves respectively having the first and second frequencies, and transmit therethrough electromagnetic waves having the other frequencies.

For example, in the wireless LAN, the electromagnetic waves having two types of frequencies are used, i.e., the electromagnetic wave having the frequency of 2.4 GHz and that having the frequency of 5.2 GHz. In an environment where electromagnetic waves having two types of frequencies are used, such as the wireless LAN environment, there is required an electromagnetic screen that selectively shields the electromagnetic waves having the two types of working frequencies, and transmits therethrough electromagnetic waves having the other unused frequencies (e.g., electromagnetic waves used for cellular phone communications, those for TV broadcasting, etc.). As described above, the electromagnetic screen 40 according to Embodiment 5 can selectively shield the electromagnetic waves having the two specific frequencies (first and second frequencies) and transmit therethrough those having the other frequencies. For this reason, the second electromagnetic shielding body according to the present invention is preferable for such environment where electromagnetic waves having two types of frequencies are used, such as the wireless LAN environment.

For example, in an environment where electromagnetic waves having three or more types of frequencies are used, the reflective layer 3 may consist of antennas of three or more types of mutually different sizes.

The first antenna 41 has three first element parts 41a and three second element parts 41b as illustrated in FIGS. 22 and 23. The three first element parts 41a radially extend from the center C2 of the antenna by substantially the same length such that any two of the three first element parts 41a form an angle of 120° with each other.

Each of the second element parts 41b is connected to an outer edge of a corresponding one of the first element parts 41a. A length (L4) of the first element part 41a and that (L5) of the second element part 41b may be different from each other, or may be the same as each other. Preferably, the length (L4) of the first element part 41a and that (L5) of the second element part 41b meet a relational expression of $0<L5<2(3)^{1/2}/L4$. If L5 is equal to or more than $2(3)^{1/2}/L4$, neighboring two of the second element parts 41b come into contact with each other, resulting in a loss of a desired electromagnetic wave shielding effect. From the perspective of providing higher shielding ratios for the electromagnetic waves having the specific frequencies, the length (L5) of the second element part 41b is preferably not less than 0.5 times and not more than 2 times the length (L4) of the first element part 41a. More preferably, it is not less than 0.75 times and not more than 2 times.

Each of the second element parts 41b may be connected at its center to an outer edge of a corresponding one of the first element parts 41a. Each of the second element parts 41b and the first element part 41a connected thereto may form a right angle (90 degrees) with each other. Also, a width of the first element part 41a and that of the second element part 41b may be different from each other, or may be the same as each other. In Embodiment 5, the width of the first element part 41a and that of the second element part 41b are made to be substantially the same width (L6).

As illustrated in FIGS. 22 and 23, the second antenna 42 also has three first element parts 42a and three second element parts 42b, similarly to the first antenna 41. The three first element parts 42a radially extend from the center C3 of the antenna by substantially the same length such that any two of the three first element parts 42a form an angle of 120° with each other.

Each of the second element parts 42b is connected to an outer edge of a corresponding one of the first element parts 42a. A length (L7) of the first element part 42a and that (L8) of the second element part 42b may be different from each other, or may be the same as each other. Preferably, the length (L7) of the first element part 42a and that (L8) of the second element part 42b meet a relational expression of $0<L8<2(3)^{1/2}/L7$. Also, from the perspective of providing higher shielding ratios for the electromagnetic waves having the specific frequencies, the length L8 of the second element part 42b is preferably not less than 0.5 times and not more than 2 times the length (L7) of the first element part 42a. More preferably, it is not less than 0.75 times and not more than 2 times.

Each of the second element parts 42b may be connected at its center to an outer edge of a corresponding one of the first element parts 42a. Also, each of the second element parts 42b and the first element part 42a connected thereto may form a right angle (90 degrees) with each other. Further, a width of the first element part 42a and that of the second element part 42b may be different from each other, or may be the same as each other. In Embodiment 5, the width of the first element part 42a and that of the second element part 42b are made to be substantially the same width (L9).

As described above, each of the first and second antennas 41 and 42 has the second element part 41b (42b) connected to the outer edge of the first element part 41a (42a). For this reason, each of the antennas 41 and 42 has higher frequency selectivity than the conventional Y-shaped linear antenna. In other words, each of the first and second antennas 41 and 42 has a reflection peak having a relatively narrow frequency width. Accordingly, the electromagnetic screen 40 can shield the electromagnetic waves having the specific frequencies (first and second frequencies) with higher selectivity.

The lengths L4 (L7) and L5 (L8) of the first and second element parts 41a (42a) and 41b (42b) and frequencies (specific frequencies) of electromagnetic waves to be reflected by the antenna 41 (42) correlate with each other. For this reason, the lengths L4 (L7) and L5 (L8) of the first and second element parts 41a (42a) and 41b (42b) may be appropriately determined depending on desired specific frequencies. For example, if the lengths L4 (L7) and L5 (L8) of the first and second element parts 41a (42a) and 41b (42b) are the same as each other, the specific frequencies (first and second frequencies) can be lowered by increasing the lengths L4 (L7) and L5 (L8) of the first and second element parts 41a (42a) and 41b (42b)

Described in detail below with reference to the drawings are the electromagnetic wave shielding properties of the electromagnetic screen 40 for the case where the lengths L4 (L7) and L5 (L8) of the first and second element parts 41a (42a) and 41b (42b) are the same as each other.

Figure 25:
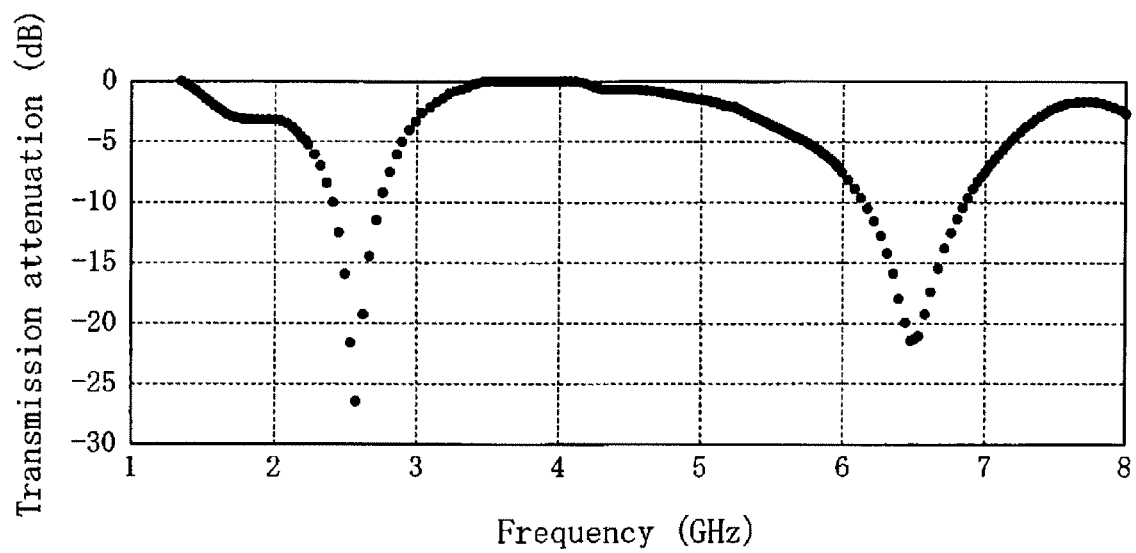
FIG. 25 is a graph representing a relationship between a frequency of an electromagnetic wave and a transmission attenuation of the electromagnetic wave transmitted through the electromagnetic screen 1.

FIG. 25 is a graph representing a relationship between a frequency of an electromagnetic wave and a transmission attenuation of the electromagnetic wave transmitted through the electromagnetic screen 40.

Note that in FIG. 25, the lengths L4 (L7) and L5 (L8) of the first and second element parts 41a (42a) and 41b (42b) are respectively 10.6 mm (5.0 mm), and the widths L6 (L9) of them are respectively 0.7 mm.

As illustrated in FIG. 25, the electromagnetic waves having the two types of frequencies, i.e., the first frequency (approximately 2.6 GHz) and second frequency (approximately 6.6 GHz), among those incident on the electromagnetic screen 40 are attenuated by the electromagnetic screen 40. In other words, the electromagnetic screen 40 selectively shields the electromagnetic waves in frequency bandwidths around the specific frequencies (approximately 2.6 and 6.6 GHz) among those incident on the electromagnetic screen 40. This is because the pluralities of first and second antennas 41 and 42 included in the reflective layer 3 selectively reflect the electromagnetic waves in the frequency bandwidths around the specific frequencies. Specifically, in the electromagnetic shielding body 40, the larger first antennas 41 reflect the electromagnetic waves in the frequency bandwidth around the lower first frequency (approximately 2.6 GHz), and the smaller second antennas 42 reflect those in the frequency bandwidth around the higher second frequency (approximately 6.6 GHz).

Note that the frequency of the electromagnetic wave reflected by the first or second antennas 41 or 42 is determined by the lengths (element length L) of the first and second element parts 41a (or 42a) and 41b (or 42b).

Figure 26:
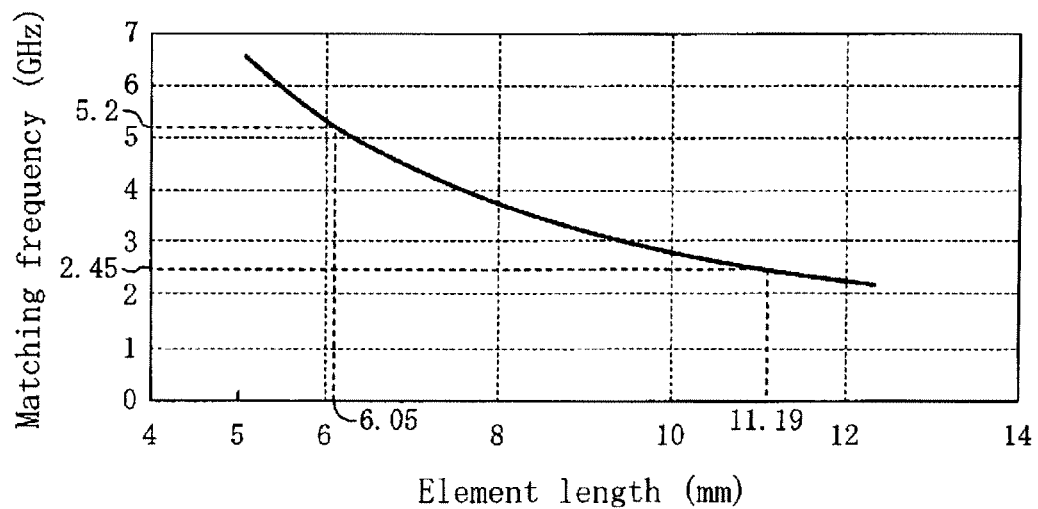
FIG. 26 is a graph representing a relationship between the element length L and a frequency of an electromagnetic wave reflected by the antenna 41 or 42.

FIG. 26 is a graph representing a relationship between the element length L and the frequency of the electromagnetic wave reflected by the antennas 41 or 42. Specifically, the graph illustrated in FIG. 26 is created based on results obtained by measuring, under a condition where the antennas are in contact with air, an electromagnetic screen in which the antennas made of an electrically conductive material are formed on a surface of a PET film having a thickness of 60 μm (see 2 for the arrangement of the antennas).

As illustrated in FIG. 26, with increasing the element length L, the frequency of the electromagnetic wave reflected by the antennas 41 or 42 is lowered. In other words, with increasing the element length L, a wavelength of the electromagnetic wave reflected by the antennas 41 or 42 becomes longer. On the other hand, the frequency of the reflected electromagnetic wave does not significantly correlate with the width L6 or L9. That is, the frequency of the reflected electromagnetic wave is mainly dependent on the element length L.

Consequently, based on the relationship between the element length L and the selected frequency, the element length L can be calculated from a frequency (specific frequency) of a desired electromagnetic wave that the antennas of each type are made to reflect. For example, if the electromagnetic screen 40 for shielding the electromagnetic waves having the frequencies of 2.45 and 5.2 GHz used for the wireless LAN is fabricated, L4, L5 of the first antenna 41 can be made to be 11.19 mm, and L7, L8 of the second antenna 42 to be 6.05 mm, based on FIG. 26.

Figure 27:
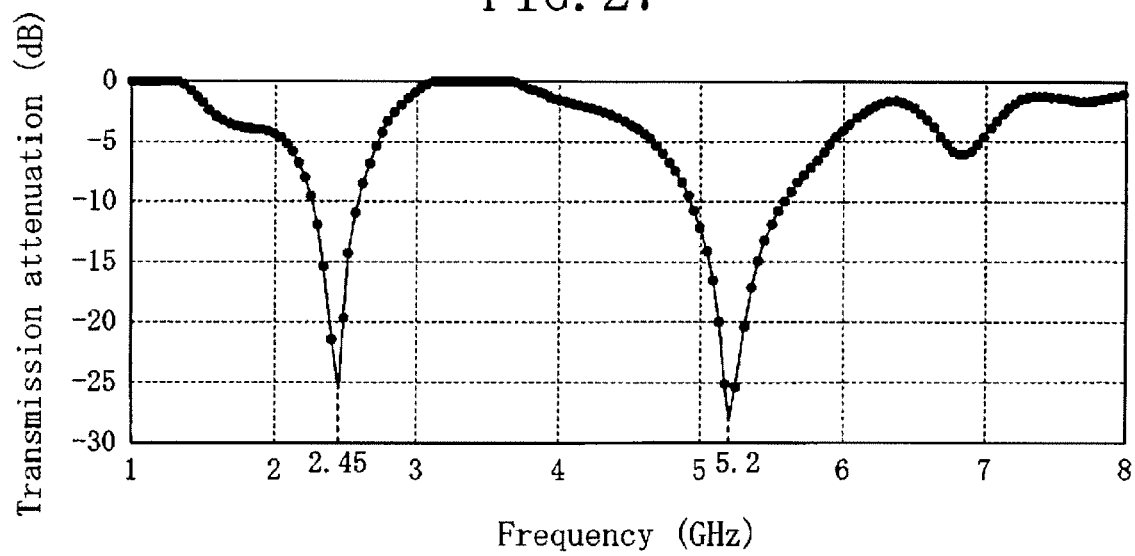
FIG. 27 is a graph representing the transmission attenuation of the electromagnetic screen 40 in which a length L4 (=L5) and a width L6 of the first antenna 41 are 11.19 mm and 0.7 mm, respectively, and a lengths L7 (=L8) and a width L9 of the second antenna 42 are 6.05 mm and 0.7 mm, respectively.

FIG. 27 is a graph representing a transmission attenuation of the electromagnetic screen 40 in which the length L4, L5 and width L6 of the first antenna 41 are made to be 11.19 mm and 0.7 mm, respectively, and the length L7, L8 and width L9 of the second antenna 42 to be 6.05 mm and 0.7 mm, respectively.

As illustrated in FIG. 27, the electromagnetic screen 40 designed based on the graph in FIG. 26 can selectively shield the electromagnetic waves having the frequencies of 2.45 and 5.2 GHz, which are electromagnetic waves the electromagnetic screen 40 is made to attempt to shield.

Alternatively, the specific frequency may be adjusted by, for example, adjusting the length L5 (L8) of the second element part 41b (42b) while fixing the length L4 (L7) of the first element part 41a (42a) constant. Specifically, by decreasing the length L5 (L8) of the second element part 41b (42b), the specific frequency can be made higher.

For example, in the conventional Y-shaped linear antenna (not having any second element part but consisting of only the first element parts), the specific frequency can be adjusted only by adjusting the length of the first element part. On the other hand, in the electromagnetic screen 40, as described above, the specific frequency can be adjusted by adjusting the length L4 (L7) of the first element part 41a (42a) as well as the length L5 (L8) of the second element part 41b (42b), or alternatively by adjusting a ratio of the length L5 (L8) of the second element pat 41b (42b) to that L4 (L7) of the first element part 41a (42a) while fixing the length L4 (L7) of the first element part 41a (42a) constant. Accordingly, the electromagnetic screen 40 having a wide design margin can be provided.

Meanwhile, in a case of the conventional Y-shaped linear antenna, it is difficult to efficiently arrange many more linear antennas of different two types per unit area. This is described in detail below with reference to FIG. 28.

Figure 28:
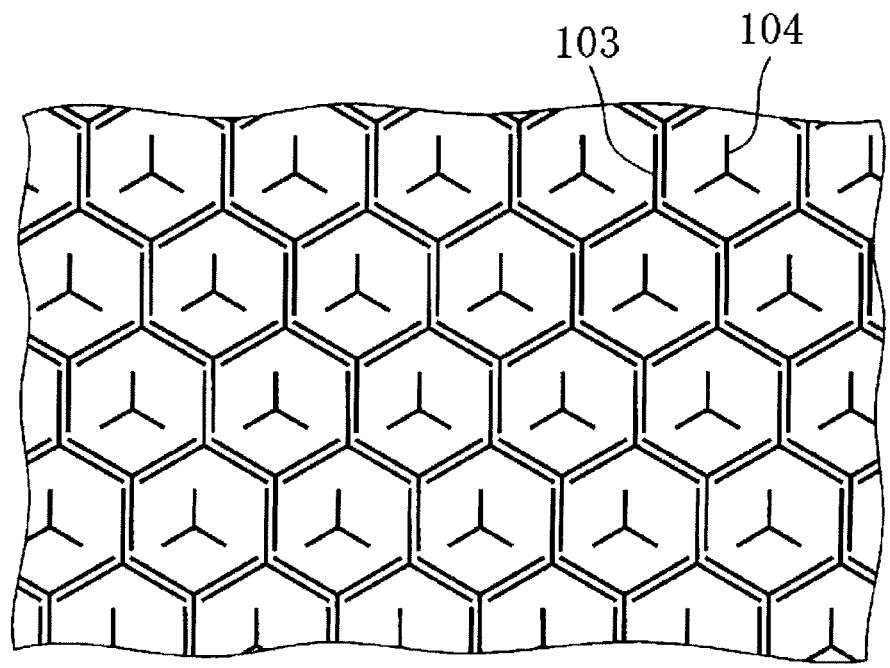
FIG. 28 is a plan view for describing an electromagnetic screen having the Y-shaped antennas of two types, large and small, in which relatively large antennas 103 are arranged in a lattice pattern such that element parts each belonging to a corresponding one of the relatively different large antennas face to each other.

FIG. 28 is a plan view for describing an electromagnetic screen having Y-shaped antennas of two types, large and small, in which relatively large antennas 103 are arranged in a lattice pattern such that element parts each belonging to a corresponding one of the relatively large antennas 103 face to each other.

As illustrated in FIG. 28, in the case where the relatively large antennas 103 (hereinafter occasionally referred to as "large antennas 103") are placed such that the element parts each belonging to a corresponding one of the large antennas 103 face to each other, it is difficult to array relatively small antennas 104 (hereinafter occasionally referred to as "small antennas 104") such that element parts each belonging to a corresponding one of the small antennas 104 face to each other. Also, the large antennas 103 are densely arranged; however, the small antennas 104 included per unit area are smaller in number than the large antennas 103 and not densely arranged. For this reason, the electromagnetic screen illustrated in FIG. 28 cannot shield at a sufficiently high shielding ratio an electromagnetic wave that the small antennas 104 target, compared with an electromagnetic wave that the large antennas 103 target. Accordingly, the electromagnetic screen described in FIG. 28 hardly shields a plurality of types of electromagnetic waves having different frequencies respectively at the same shielding ratio.

Further, it is also difficult to efficiently array per unit area many more Jerusalem cross type antennas of two types different in size from each other. Still further, it is particularly difficult to efficiently arrange the Jerusalem cross type antennas of two types different in size from each other so as to provide an aspect in which the second element parts each belonging to a corresponding one of the antennas face to each other. The difficulty is described in detail below with reference to the drawings.

Figure 29:
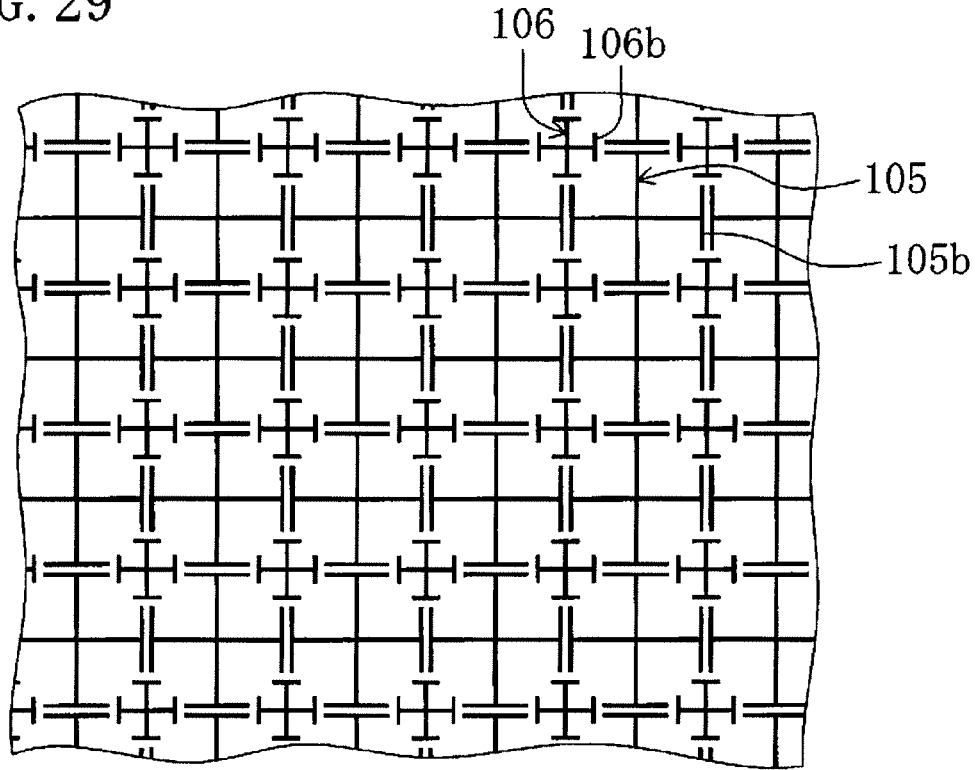
FIG. 29 is a plan view for describing an electromagnetic screen having Jerusalem cross type antennas of two types, large and small, in which relatively large antennas 105 are arranged in a lattice pattern such that segment-shaped parts each belonging to a corresponding one of the relatively large antennas face to each other.

FIG. 29 is a plan view for describing an electromagnetic screen having the Jerusalem cross type antennas of two types, large and small, in which relatively large antennas 105 are arrayed in a lattice pattern such that segment-shaped parts each belonging to a corresponding one of the relatively large antennas 105 face to each other.

In the electromagnetic screen having the Jerusalem cross type antennas illustrated in FIG. 29, the relatively large antennas 105 (hereinafter occasionally referred to "large antennas 105") are arranged such that second element parts 105*b* respectively belonging to neighboring two of the large antennas 105 face to each other at a close distance. For this reason, an electromagnetic wave having a specific frequency corresponding to the large antennas 105 is well shielded. However, regarding relatively small antennas 106 (hereinafter occasionally referred to as "small antennas 106"), an arrangement in which second element parts 106*b* respectively belonging to neighboring two of the small antennas 106 face to each other is not taken. For this reason, reflectance for an electromagnetic wave having a specific frequency corresponding to the small antennas 106 decreases. Accordingly, this electromagnetic screen cannot sufficiently shield the electromagnetic wave having the specific frequency corresponding to the small antennas 106. Consequently, the electromagnetic screen illustrated in FIG. 29 hardly shields a plurality of types of electromagnetic waves having different frequencies respectively at the same shielding ratio.

Figure 30:
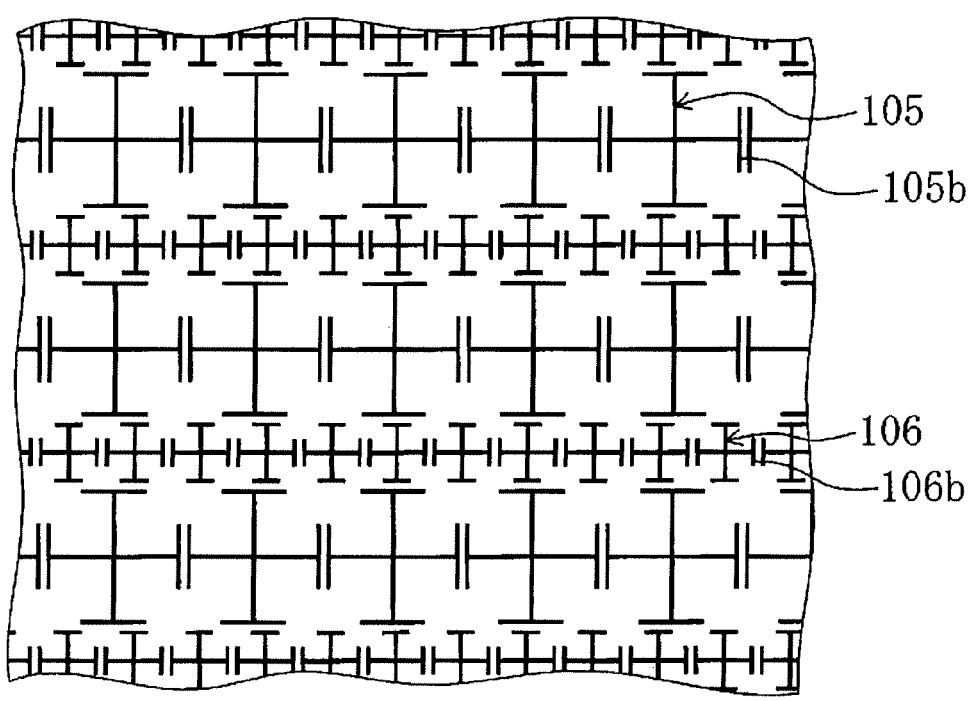
FIG. 30 is a plan view of an electromagnetic screen in which the large antennas 105 and the small antennas 106 are arrayed such that the second element parts each belonging to a corresponding one of the large antennas 105 face to each other, and those each belonging to a corresponding one of the small antennas 106 face to each other.

FIG. 30 is a plan view of an electromagnetic screen in which the large antennas 105 and the small antennas 106 are arrayed such that the second element parts each belonging to a corresponding one of the large antennas 105 face to each other, and those of the small antennas 106 face to each other.

In the electromagnetic screen illustrated in FIG. 30, the large antennas 105 are arranged such that the second element parts 105*b* respectively belonging to neighboring two of the large antennas 105 closely face to each other in a specific direction (lateral direction in FIG. 30). The small antennas 106 are also arranged such that the second element parts 106*b* respectively belonging to neighboring two of the small antennas 106 closely face to each other in a specific direction (lateral direction in FIG. 30). For this reason, the electromagnetic screen illustrated in FIG. 30 can well shield electromagnetic waves having specific frequencies incident from the array direction of the antennas 105 and 106 (lateral direction in FIG. 30). However, in the electromagnetic screen illustrated in FIG. 30, the second element parts 105*b* each belonging to a corresponding one of the large antennas 105, or those 106*b* of the small antenna 106 do not closely face to each other in a direction (e.g., vertical direction in FIG. 30) forming an angle with the array direction of the antennas 105 and 106. For this reason, the electromagnetic waves having the specific frequencies incident from the direction (e.g., vertical direction in FIG. 30) forming an angle with the specific direction cannot be sufficiently shielded. Accordingly, in the electromagnetic screen illustrated in FIG. 30, the electromagnetic shielding ratio largely depends on an incident direction of the electromagnetic waves. That is, the configuration illustrated in FIG. 30 can hardly provide an electromagnetic screen having small electromagnetic wave incident angle dependency.

On the other hand, in the electromagnetic screen 40 according to Embodiment 5, each of the antennas 41 or 42 has the second element parts 41*b* or 42*b* each of which is connected to the outer edge of a corresponding one of the first element parts 41*a* or 42*a*. For this reason, it is relatively easy to arrange the pluralities of antennas 41 and 42 such that the second element parts 41*b* face to each other and those 42*b* face to each other. Accordingly, the electromagnetic screen 40 according to Embodiment 5 can easily provide higher electromagnetic wave shielding ratios for the electromagnetic waves having the specific frequencies. Also, in the electromagnetic screen 40 according to Embodiment 5 (see FIG. 23 for its internal arrangement), the antennas 41 and 42 for respectively shielding the electromagnetic waves having the different frequencies are formed with substantially the same density. For this reason, the electromagnetic screen 40 according to Embodiment 5 can shield the electromagnetic wave having the first frequency the first antennas 41 target and that having the second frequency the second antennas 42 target at substantially the same shielding ratio. Also, it can reduce the electromagnetic wave incident angle dependency.

Other embodiments are described in detail below with reference to the drawings, in which the pluralities of the antennas 41 and 42 are placed such that the second element parts 41*b* face to each other and those 42*b* face to each other.

Embodiment 6

Figure 31:
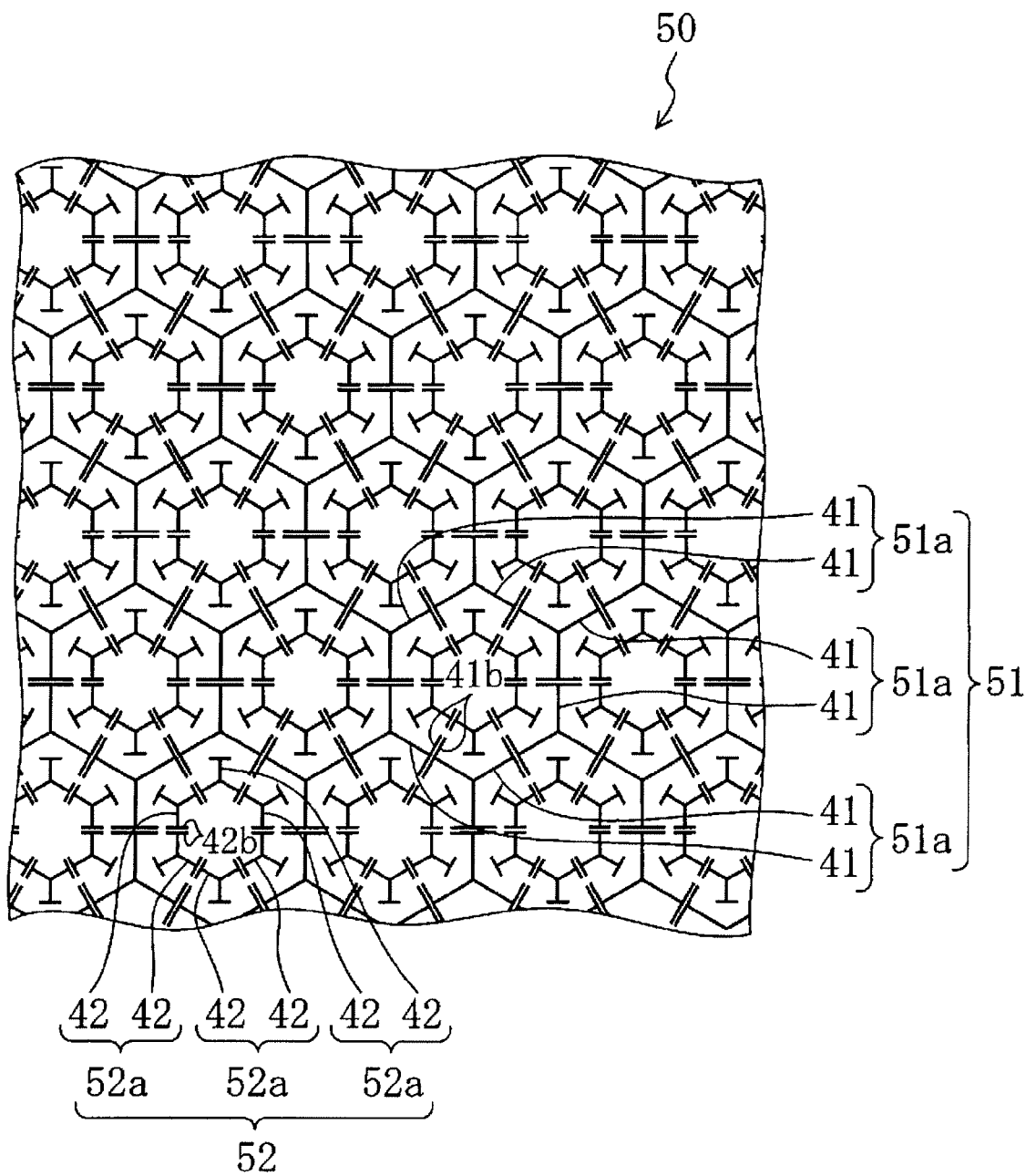
FIG. 31 is a plan view of an electromagnetic screen 50 according to Embodiment 6.

FIG. 31 is a plan view of an electromagnetic screen 50 according to Embodiment 6.

Figure 32:
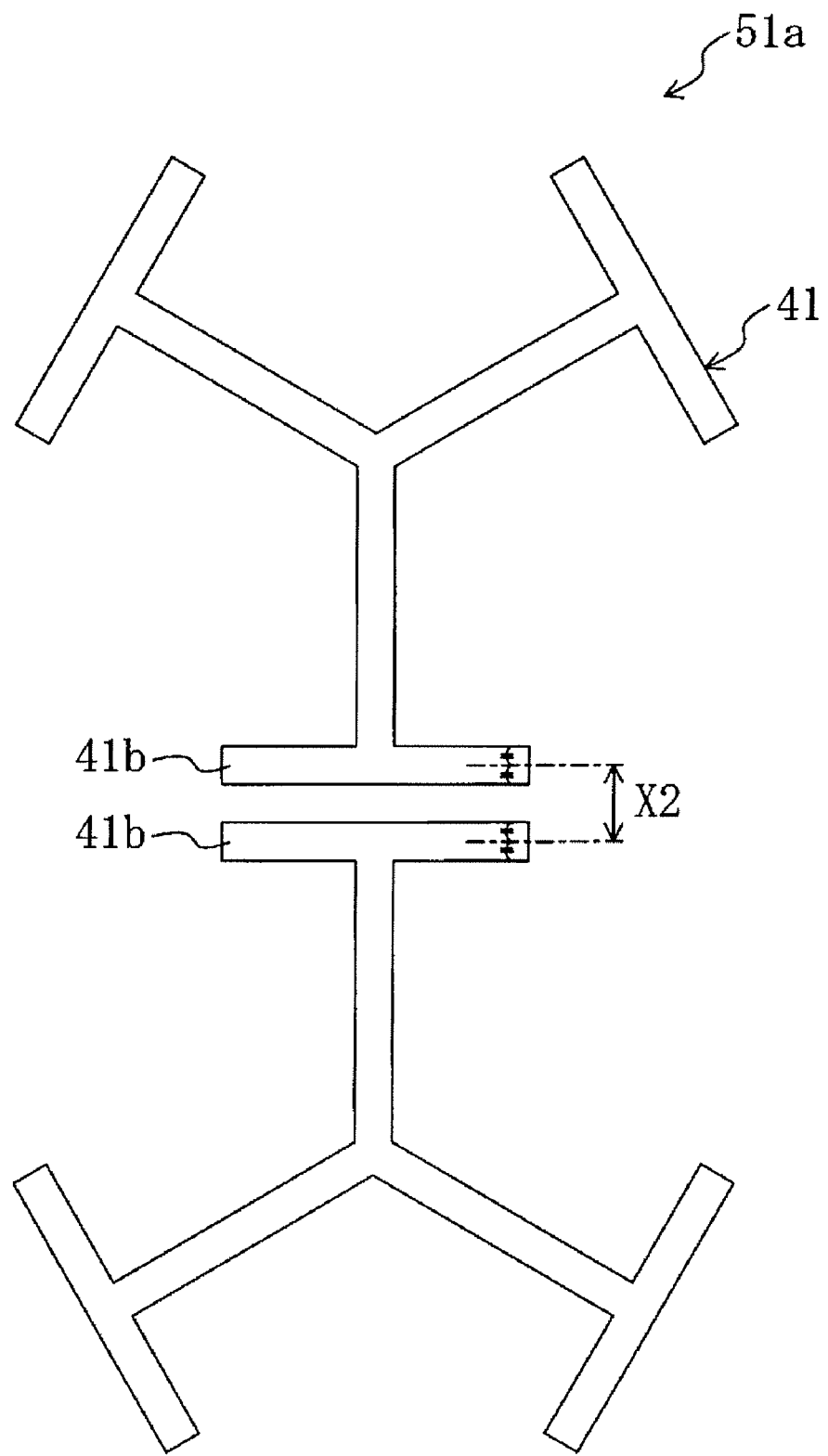
FIG. 32 is a partially enlarged plan view of the electromagnetic screen 50.
Figure 33:
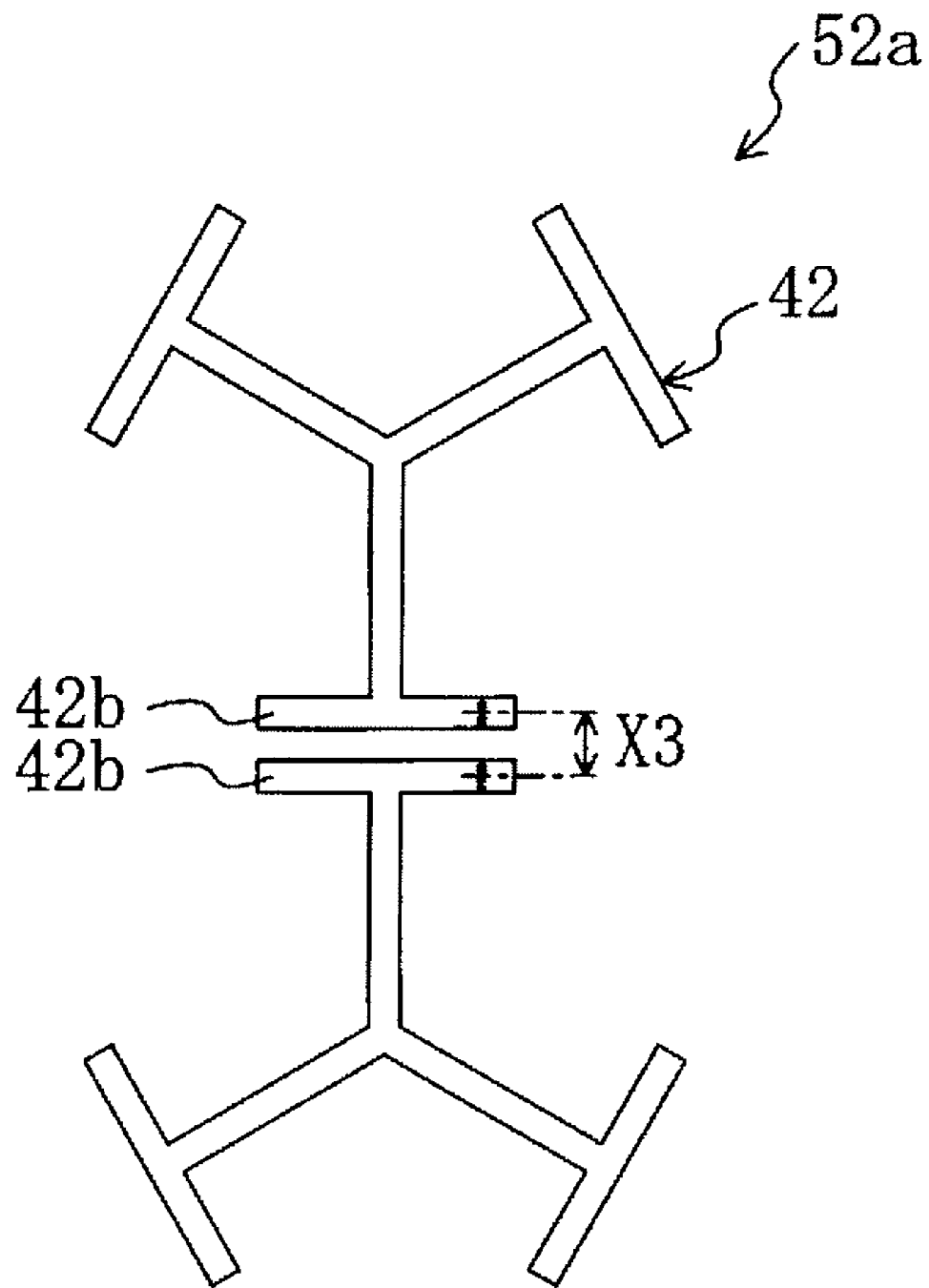
FIG. 33 is another partially enlarged plan view of the electromagnetic screen 50.

FIGS. 32 and 33 are partially enlarged plan views of the electromagnetic screen 50.

The electromagnetic screen 50 according to Embodiment 6 has a configuration same as that of the electromagnetic screen 40 according to Embodiment 5, except for arrangements of the first and second antennas 41 and 42. The arrangements of the first and second antennas 41 and 42 in Embodiment 6 are described in detail below with reference to FIGS. 31 to 33. Note that in the following description of Embodiment 6, FIG. 1 is referenced in common with Embodiment 1 or 5, and a component having substantially the same function is represented by the same reference numeral as in Embodiment 1 or 5, of which description is omitted.

In Embodiment 6, a plurality of first antennas 41 constitute a plurality of first antenna units 51*a* each of which is comprised of a pair of the first antennas 41 placed such that the second element parts 41*b* each belonging to a corresponding one of the pair of the first antennas 41 face to each other. Also, the first antenna units 51*a* further constitute hexagonal first antenna assemblies 51 in each of which the first antenna units 51*a* is placed and continuously developed in two dimensions such that the second element parts 41*b* each belonging to a corresponding one of the first antenna units 51*a* face to each other. That is, each of the first antenna assemblies 51 consists of six of the first antennas 41 circularly arranged such that the second element parts 41*b* respectively belonging to any neighboring two of the six first antennas 41 face to each other. Further, in Embodiment 6, the first antenna assemblies 51 are arranged in what is called a honeycomb shape such that the second element parts 41*b* each belonging to a corresponding one of the first antenna assemblies 51 face to each other. In addition, from the perspective of configuring the first antenna assembly 51 having low directionality, the first element part 41*a* and the second element part 41*b* preferably form a right angle with each other. Also, the second element part 41*b* is preferably connected at its center to the first element part 41*a*. Such a configuration makes the first antenna assembly 51 substantially regular hexagonal.

A plurality of second antennas 42 constitute a plurality of second antenna units 52*a* each of which is comprised of a pair of the second antennas 42 placed such that the second element parts 42*b* each belonging to a corresponding one of the pair of the second antennas 42 face to each other. Also, the second antenna units 52*a* further constitute hexagonal second antenna assemblies 52 in each of which the second antenna units 52*a* are placed and continuously developed in two dimensions such that the second element parts 42*b* each belonging to a corresponding one of the second antenna units 52*a* face to each other. That is, each of the second antenna assemblies 52 consists of six of the second antennas 42 circularly arranged such that the second element parts 42*b* respectively belonging to any neighboring two of the six second antennas 42 face to each other. In addition, from the perspective of configuring the second antenna assembly 52 having low directionality, the first element part 42*a* and the second element part 42*b* preferably form a right angle with each other. Also, the second element part 42*b* is preferably connected at its center to the first element part 42*a*. Such a configuration makes the second antenna assembly 52 substantially regular hexagonal.

In Embodiment 6, the plurality of first antennas 41 are placed such that almost any second element part 41*b* face to its neighboring second element part 41*b* in substantially parallel. Also regarding the second antennas 42, twelve of the eighteen second element parts 42*b* constituting the second antenna assembly 52 are provided such that the second element parts 42*b* respectively belonging to any neighboring two of the twelve second element parts 42*b* face to each other in substantially parallel. By configuring the antennas 41 and 42 such that the second element parts 41*b* face to each other and those 42*b* face to each other as described above, electromagnetic wave reflectances (electromagnetic wave shielding ratios) of the antennas 41 and 42 for electromagnetic waves having specific frequencies can be increased. Consequently, the electromagnetic screen 50 has high electromagnetic wave shielding ratios for the electromagnetic waves having the specific frequencies (first and second frequencies).

Specifically, a distance X2 (X3) between the second element parts 41*b* (42*b*) facing to each other is preferably not less than 0.4 mm and not more than 3 mm (see FIGS. 32 and 33). More preferably, it ranges from not less than 0.6 mm to not more than 1 mm. If the distance X2 (X3) is made less than 0.4 mm, the second element parts 41*b* (42*b*) facing to each other may undesirably come into contact with each other. On the other hand, if the distance X2 (X3) is more than 3 mm, the electromagnetic shielding ratios tend to decrease.

To make the second element parts 41*b* each belonging to a corresponding one of the first antennas 41 face to each other, make the second element parts 42*b* each belonging to a corresponding one of the second antennas 42 face to each other, and make densities of the antennas 41 and 42 of different types the same, an arrangement as illustrated in FIG. 31 is preferable, for example.

To specifically explain this with reference to FIG. 31, the first antenna assembly 51 is surrounded by the second antenna assembly 52. For this reason, the first antenna assemblies 51 and the second antenna assemblies 52 can be efficiently arranged. In other words, the numbers of the first antennas 41 and second antennas 42 included per unit area can be increased. Accordingly, the electromagnetic wave shielding ratios for the electromagnetic waves having the specific frequencies (first and second frequencies) can be increased.

In Embodiment 6, preferably, the lengths of the second element parts 41*b* and 42*b* are relatively short. By making the lengths relatively short, a degree of freedom in size of each of the second antennas 42 included in the second antenna assembly 52 surrounded by the first antenna assembly 51 can be increased. This is because the second element part 41*b* of the first antenna 41 and that 42*b* of the second antenna 42 become unlikely to come into contact with each other.

It is particularly preferable that the second element part 41*b* is short in length, and by applying such a configuration, an area surrounded by the first antenna assembly 51 can be increased. For this reason, the relatively large second antenna assembly 52 can be arranged in the area surrounded by the first antenna assembly 51. Consequently, the electromagnetic screen 50 capable of, for example, selectively shielding two types of electromagnetic waves having frequencies relatively close to each other can be provided.

Embodiment 7

Figure 34:
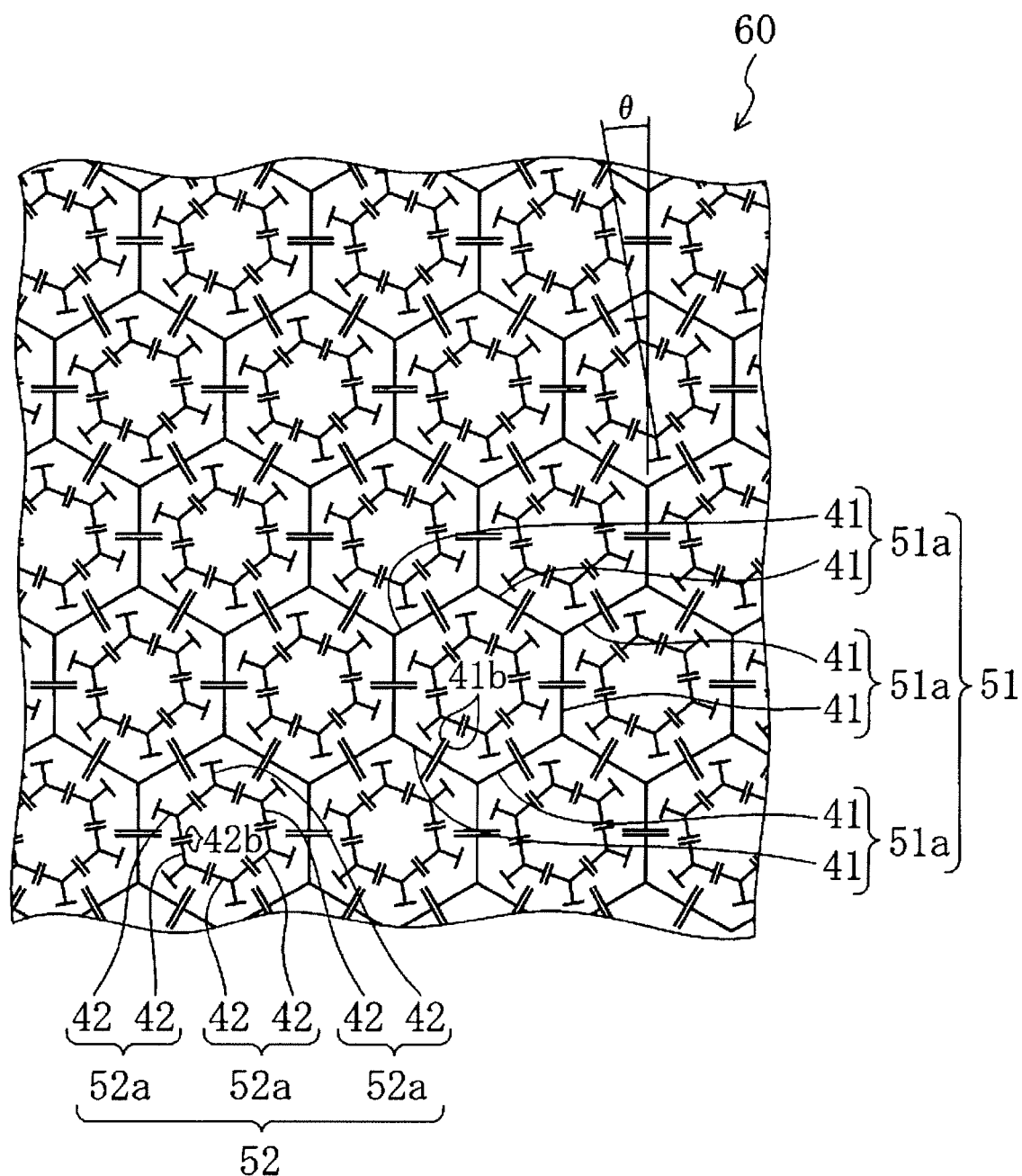
FIG. 34 is a plan view of an electromagnetic screen 20 according to Embodiment 7.

FIG. 34 is a plan view of an electromagnetic screen 60 according to Embodiment 7.

The electromagnetic screen 60 according to Embodiment 7 has a configuration same as that of the electromagnetic screen 50 according to Embodiment 6, except for a relative arrangement between the first and second antennas 41 and 42. The relative arrangement between the first and second antennas 41 and 42 in Embodiment 7 is described in detail below with reference to FIG. 34. Note that in the following description of Embodiment 7, FIG. 1 is referenced in common with Embodiment 1 or 6, and a component having substantially the same function is represented by the same reference numeral as in Embodiment 6, of which description is omitted.

In Embodiment 7, the first antenna assemblies 51 and the second antenna assemblies 52 are arranged so as to respectively have symmetrical axes (specifically, line-symmetrical axes respectively extending in array directions of the antennas 41 and 42) different from each other, i.e., to form an angle with each other.

In order to make the first antenna assembly 51 surround the second antenna assembly 52, a size of each of the second antennas 42 constituting the second antenna assembly 52 is required to be smaller than that of each of the first antennas 41 constituting the first antenna assembly 51. If the first and second antenna assemblies 51 and 52 are arranged without forming an angle with each other as illustrated in Embodiment 6, the second antenna 42 should be made very small relative to the first antenna 41 to avoid interfere between the first antenna 41 and the second antenna 42, resulting in insufficient degree of design freedom in the first and second antennas 41 and 42.

On the other hand, if the first antenna assemblies 51 and the second antenna assemblies 52 are arranged so as to form an angle (e.g., θ=10° in FIG. 34) with each other as illustrated in Embodiment 7 (FIG. 34), a relative position between the second element parts 41b facing to each other and those 42b facing to each other is shifted. For this reason, in Embodiment 7, a relative size of the second antenna 42 to the first antenna 41 can be comparatively increased, compared with the case illustrated in Embodiment 6. Accordingly, the electromagnetic screen 60 according to Embodiment 7 can increase the degrees of design freedoms in shapes and sizes of the first and second antennas 41 and 42. Specifically, shielding the two types of electromagnetic waves having the frequencies close to each other (ratio between the first and second frequencies (first frequency<second frequency) is 0.45 or more) becomes possible. Consequently, the frequencies of the two types of electromagnetic waves the electromagnetic screen 60 can shield can be relatively freely selected.

Also, in FIG. 31 or 34, the substantially hexagonal first and second antenna assemblies 51 and 52 are arranged in a close packed structure; however, they are not necessarily arranged in the close packed structure but may be appropriately adjusted in numbers depending on a desired electromagnetic wave shielding ratio.

EXAMPLES

Electromagnetic wave shielding bodies having the same configuration as the electromagnetic shielding body 1 according to Embodiment 1 were prepared under the condition that the length of the first element part 4a was fixed to 12.24 mm, the widths of the first and second element parts 4a and 4b were fixed to 1.2 mm, and the length of the second element part 4b was variously changed, and then used as Examples and Comparative example.

Specifically, the antennas 4 according to Examples and Comparative example were formed by applying silver paste onto the base materials 2 made from a PET film followed by drying, to prepare the electromagnetic shielding bodies according to Examples and Comparative example. In addition, in Example 1, the length (L2) of the second element part 4b was made to be 24.48 mm, i.e., L1:L2 was made to be 1:2. Also, in Example 2, the length (L2) of the second element part 4b was made to be 15.30 mm, i.e., L1:L2 was made to be 1:1.25. Further, in Example 3, the length (L2) of the second element part 4b was made to be 12.24 mm, i.e., L1:L2 was made to be 1:1. Still further, in Example 4, the length (L2) of the second element part 4b was made to be 9.2 mm, i.e., L1:L2 was made to be 1:0.5. On the other hand, in Comparative example, the length (L2) of the second element part 4b was made to be 0 mm, i.e., the antenna was made Y-shaped.

Figure 35:
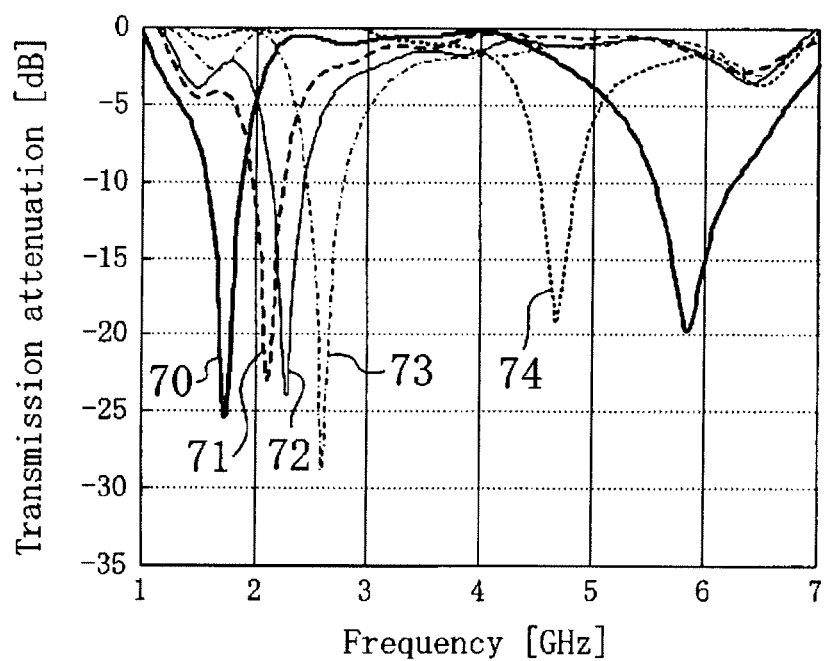
FIG. 35 is a graph representing a relationship between a frequency and the transmittance attenuation in each of Examples and Comparative example.

FIG. 35 is a graph representing a relationship between a frequency and the transmittance attenuation in each of Examples.

Data represented by Reference numeral 70 in FIG. 35 is that in Example 1. Also, data represented by 71 is that in Example 2. Further, data by 72 is that in Example 3. Still further, data by 73 is that in Example 4. On the other hand, data represented by 74 is that in Comparative example.

Figure 36:
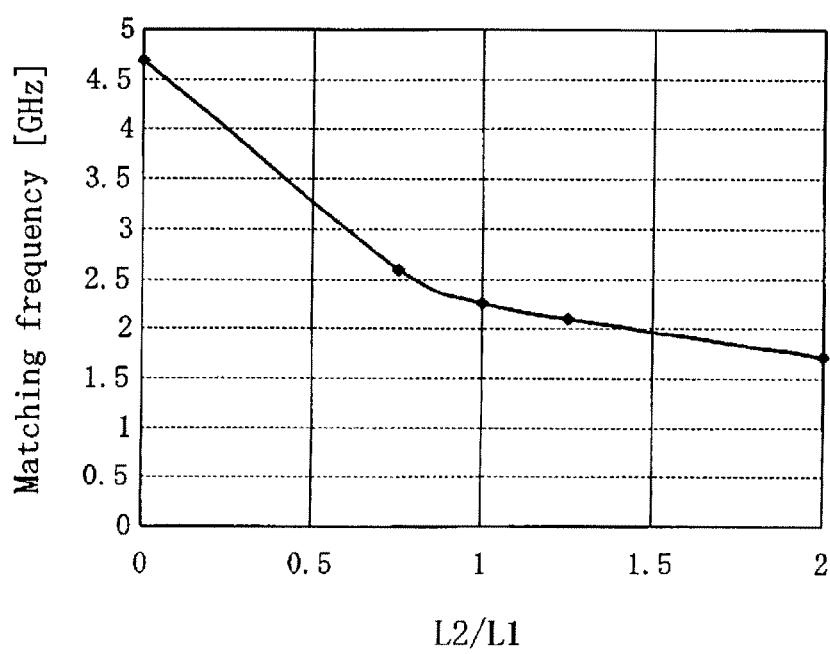
FIG. 36 is a graph representing a correlation between L2/L1 and the matching frequency in each of Examples and Comparative example.

FIG. 36 is a graph representing a correlation between the ratio in length (L2/L1) between the first and second element parts 4a and 4b and the matching frequency in each of Examples and Comparative example.

As illustrated in FIG. 35, the electromagnetic wave shielding bodies having the second element parts 4b according to Examples 1 to 4 had higher electromagnetic wave shielding ratios than that according to Comparative example. It has turned out from the results that any of the electromagnetic wave shielding bodies having the second element parts 4b according to Examples 1 to 4 can shield electromagnetic waves having specific frequencies at higher electromagnetic wave shielding ratios than that according to Comparative example having the so-called Y-shaped antennas.

Also, the electromagnetic wave shielding bodies having the second element parts 4b according to Examples 1 to 4 exhibited sharper peaks than that according to Comparative example not having any second element part 4b but provided with the so-called Y-shaped antennas. That is, it has turned out that any of the electromagnetic wave shielding bodies having the second element parts 4b according to Examples 1 to 4 has higher frequency selectivity and can shield the electromagnetic waves having the specific frequencies with the higher selectivity than that according to Comparative example provided with the so-called Y-shaped antennas.

Further, it has turned out that as illustrated in FIGS. 35 and 36, with increasing the ratio in length (L2/L1) between the first and second element parts 4a and 4b, the matching frequency tends to be lowered. Based on this finding, it has turned out that the matching frequency can be adjusted by adjusting the length of the second element part 4b.

INDUSTRIAL APPLICABILITY

As described above, the electromagnetic screen according to the present invention has a higher electromagnetic wave shielding ratio for an electromagnetic wave having a specific frequency, and is therefore useful for wallpaper, partition, fabric (roll screen), windowpane, exterior wall panel, roof board, ceiling board, interior wall panel, floor board, electromagnetic screen, etc.

The invention claimed is:

1. An electromagnetic screen comprising a plurality of antennas that are arranged so as to constitute a pattern and reflect an electromagnetic wave having a specific frequency, each of the plurality of antennas comprising: three segment-shaped first element parts radially extending from a center of the antenna by a substantially same length such that any two of the three first element parts form an angle of 120° with each other; and a segment-shaped second element part connected to an outer edge of each of the first element parts and arranged so as to form a right angle with the each of the first element parts, and having the same length as that of the each of the first element parts.

2. An electromagnetic screen comprising a plurality of antennas that are arranged so as to constitute a pattern and reflect an electromagnetic wave having a specific frequency, each of the plurality of antennas comprising: three segment-shaped first element parts radially extending from a center of the antenna by a substantially same length such that any two of the three first element parts form an angle of 120° with each other; and a segment-shaped second element part connected to an outer edge of each of the first element parts, wherein
the plurality of antennas constitute a plurality of antenna units, each of the plurality of antenna units being comprised of a pair of the antennas in which the second element parts each belonging to a corresponding one of the pair of the antennas are placed so as to face to each other.

3. The electromagnetic screen according to claim 2, wherein the plurality of antennas constitute a plurality of substantially regular hexagonal antenna assemblies in each of which the plurality of antenna units are placed and continuously developed in two dimensions such that the second element parts each belonging to a corresponding one of the plurality of antenna units face to each other.

4. An electromagnetic screen comprising a plurality of types of antennas that are arranged so as to constitute a pattern and reflect electromagnetic waves having specific frequencies different from one another, each of the antennas comprising:

three segment-shaped first element parts radially extending from a center of the antenna by a substantially same length such that any two of the three first element parts form an angle of 120° with each other; and a segment-shaped second element part connected to an outer edge of each of the first element parts, arranged so as to form a right angle with the each of the first element parts, and having the same length as that of the each of the first element parts.

5. The electromagnetic screen according to claim 4, wherein the plurality of types of antennas are different in size from one another.

6. An electromagnetic screen comprising: a plurality of first antennas for reflecting an electromagnetic wave having a first frequency; and a plurality of second antennas for reflecting an electromagnetic wave having a second frequency, the pluralities of first and second antennas being arranged so as to constitute a pattern, each of the pluralities of first and second antennas comprising: three segment-shaped first element parts radially extending from a center of the antenna by a substantially same length such that any two of the three first element parts form an angle of 120° with each other; and a segment-shaped second element part connected to an outer edge of each of the first element parts, arranged so as to form a right angle with the each of the first element parts, and having the same length as that of the each of the first element parts.

7. The electromagnetic screen according to claim 6, wherein the first antenna and the second antenna are different in size from each other.

8. An electromagnetic screen comprising: a plurality of first antennas for reflecting an electromagnetic wave having a first frequency; and a plurality of second antennas for reflecting an electromagnetic wave having a second frequency, the pluralities of first and second antennas being arranged so as to constitute a pattern, each of the pluralities of first and second antennas comprising: three segment-shaped first element parts radially extending from a center of the antenna by a substantially same length such that any two of the three first element parts form an angle of 120° with each other; and a segment-shaped second element part connected to an outer edge of each of the first element parts, wherein:

the plurality of first antennas constitute a plurality of first antenna units, each of the plurality of first antenna units being comprised of a pair of the first antennas in which the second element parts each belonging to a corresponding one of the pair of the first antennas are placed so as to face to each other; and the plurality of second antennas constitute a plurality of second antenna units, each of the plurality of second antenna units being comprised of a pair of the second antennas in which the second element parts each belonging to a corresponding one of the pair of the second antennas are placed so as to face to each other.

9. The electromagnetic screen according to claim 8, wherein:

the plurality of first antennas constitute a plurality of substantially regular hexagonal first antenna assemblies in each of which the plurality of first antenna units are further placed and continuously developed in two dimensions such that the second element parts each belonging to a corresponding one of the first antennas face to each other; and the plurality of second antennas constitute a plurality of substantially regular hexagonal second antenna assemblies in each of which the plurality of second antenna units are further placed and continuously developed in two dimensions such that the second element parts each belonging to a corresponding one of the second antennas face to each other.

10. The electromagnetic screen according to claim 9, wherein the second antenna assembly is surrounded by the first antenna assembly.

11. The electromagnetic screen according to claim 10, wherein the first antenna assembly and the second antenna assembly respectively have symmetrical axes different from each other.

12. The electromagnetic screen according to any one of claims 1, 4, and 6, wherein each of the antennas includes an electrically conductive material.

13. The electromagnetic screen according to claim 12, wherein each of the antennas includes at least any of copper, aluminum, and silver as the electrically conductive material.

14. The electromagnetic screen according to any one of claims 1, 4, and 6, wherein each of the second element part is connected at its center to the first element part.

15. The electromagnetic screen according to any one of claims 1, 4, and 6, wherein the first element part and the second element part have a substantially same length.

16. The electromagnetic screen according to any one of claims 1, 4, and 6, wherein each of the antennas is comprised of a metal film having an opening.

17. The electromagnetic screen according to claim 16, wherein an area ratio of the metal film to the antenna is not less than 2.5% and not more than 30%.

18. The electromagnetic screen according to any one of claims 1, 4, and 6, wherein a width of the second element part is the same as that of one of the first element part.

* * * * *